(12) United States Patent
Tajima et al.

(10) Patent No.: US 7,820,366 B2
(45) Date of Patent: Oct. 26, 2010

(54) METHOD OF WRITING IDENTIFYING INFORMATION ON WAFER

(75) Inventors: Shigekazu Tajima, Tokyo (JP); Satoshi Tsukiyama, Tokyo (JP); Akio Iijima, Hong Kong (CN)

(73) Assignees: SAE Magnetics (H.K.) Ltd., Hong Kong (CN); TDK Corporation, Tokyo (JP)

( * ) Notice: Subject to any disclaimer, the term of this patent is extended or adjusted under 35 U.S.C. 154(b) by 840 days.

(21) Appl. No.: 11/350,733

(22) Filed: Feb. 10, 2006

(65) Prior Publication Data

US 2006/0228651 A1   Oct. 12, 2006

(30) Foreign Application Priority Data

Apr. 6, 2005   (JP) .............................. 2005-109702

(51) Int. Cl.
*G03F 7/20* (2006.01)
(52) U.S. Cl. ........................................ 430/312; 430/394
(58) Field of Classification Search ................. 430/311, 430/312, 313, 394, 22
See application file for complete search history.

(56) References Cited

U.S. PATENT DOCUMENTS

| | | | | |
|---|---|---|---|---|
| 4,670,090 A | * | 6/1987 | Sheng et al. ................. | 438/571 |
| 5,733,711 A | * | 3/1998 | Juengling ..................... | 430/312 |
| 6,623,911 B1 | * | 9/2003 | Jong et al. ................... | 430/313 |
| 6,924,090 B2 | | 8/2005 | Hirooka | |
| 7,354,699 B2 | | 4/2008 | Hirooka | |
| 2003/0059726 A1 | * | 3/2003 | Hirooka ....................... | 430/394 |

FOREIGN PATENT DOCUMENTS

| | | |
|---|---|---|
| JP | A 62-20116 | 1/1987 |
| JP | A-63-275115 | 11/1988 |
| JP | A-2-015612 | 1/1990 |
| JP | A 2002-184672 | 6/2002 |
| JP | A-2003-131391 | 5/2003 |
| JP | A-2003-140366 | 5/2003 |

* cited by examiner

*Primary Examiner*—Kathleen Duda
*Assistant Examiner*—Brittany Raymond
(74) *Attorney, Agent, or Firm*—Oliff & Berridge, PLC

(57) ABSTRACT

A method of writing identifying information comprises: the step of forming a metal film on a wafer; the step of forming a resist layer on the metal film; the step of exposing the resist layer by projecting a pattern for an alignment mark on the resist layer; the first development step of developing the resist layer; the step of exposing the resist layer by projecting a pattern for the identifying information onto the resist layer using the pattern formed in the resist layer in the first development step as a reference of a location; the second development step of developing the resist layer; the step of selectively etching the metal film using the resist layer as an etching mask; and removing the resist layer.

14 Claims, 45 Drawing Sheets

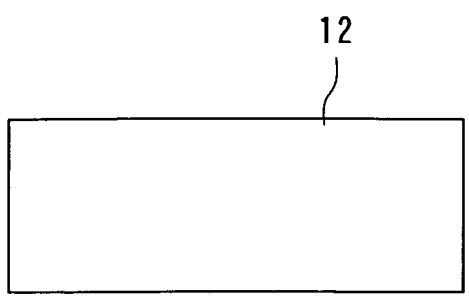
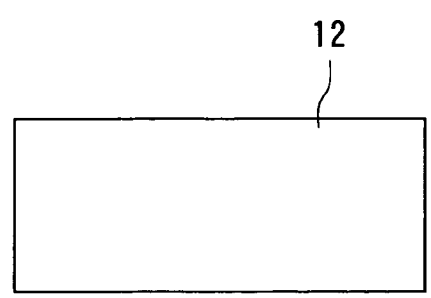
FIG. 3A
FIG. 3B
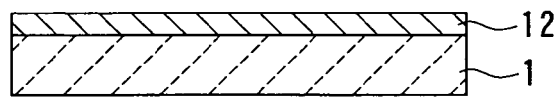
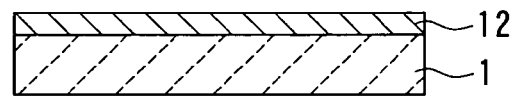
FIG. 3C
FIG. 3D

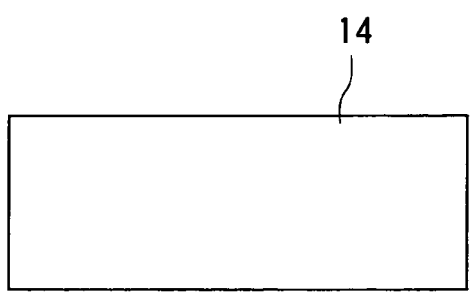
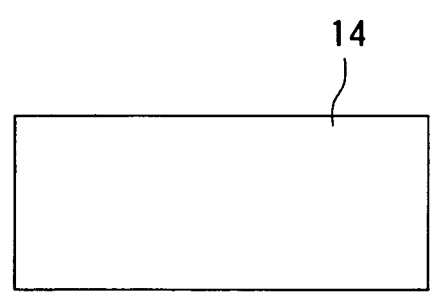
FIG. 4A    FIG. 4B
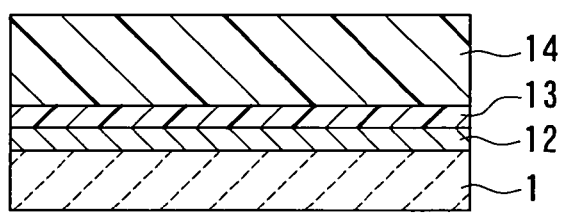
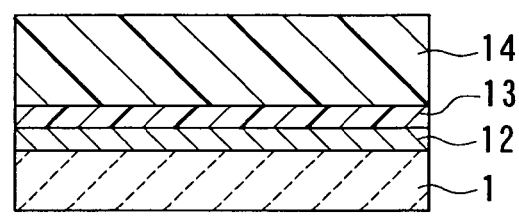
FIG. 4C    FIG. 4D

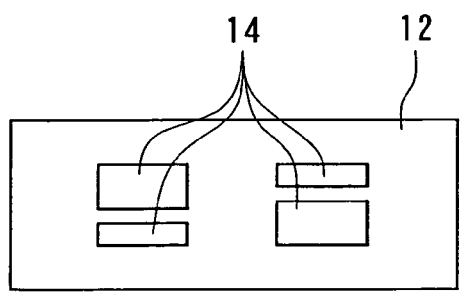
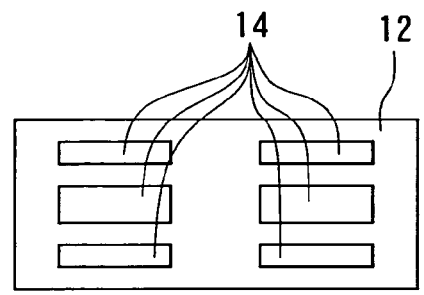
FIG. 8A            FIG. 8B
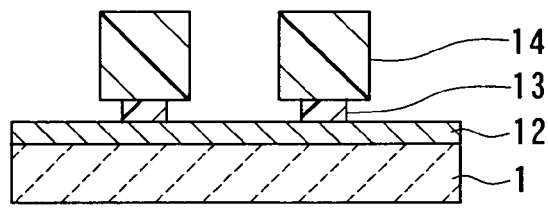
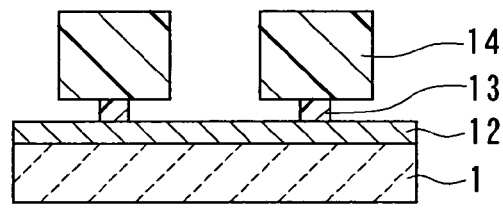
FIG. 8C            FIG. 8D

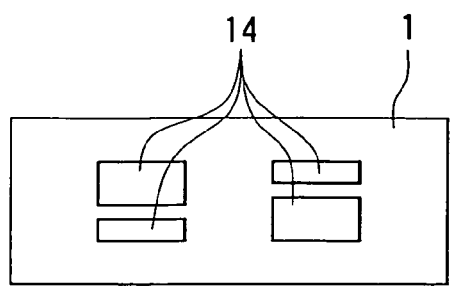
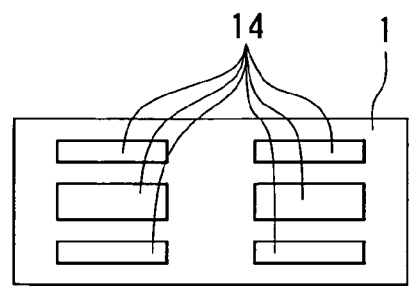
FIG. 9A                    FIG. 9B
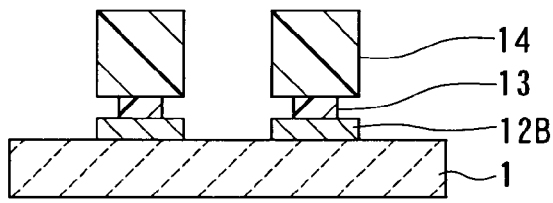
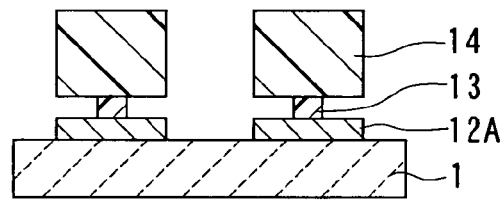
FIG. 9C                    FIG. 9D

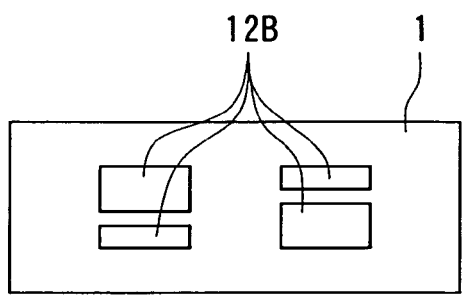
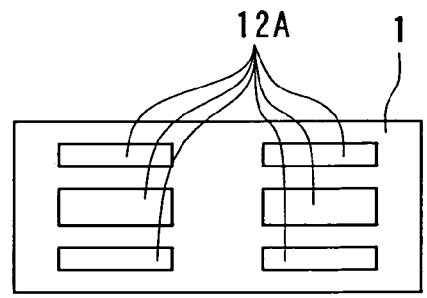
FIG. 10A                    FIG. 10B
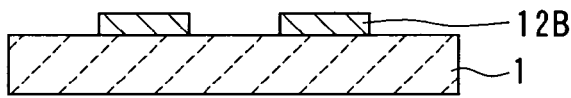
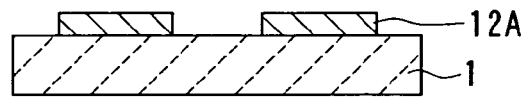
FIG. 10C                    FIG. 10D

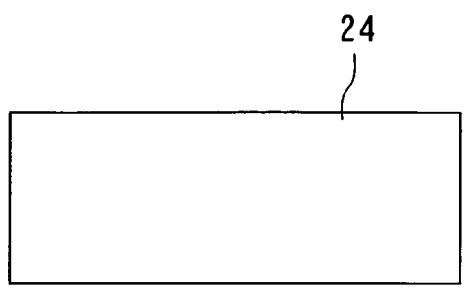
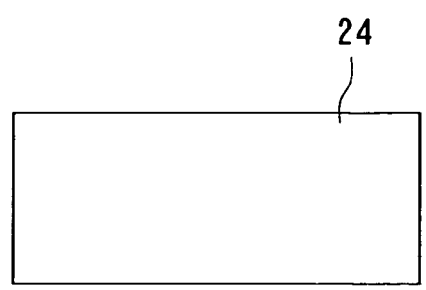
FIG. 12A                FIG. 12B
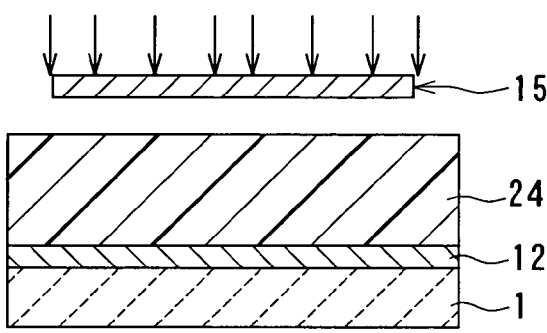
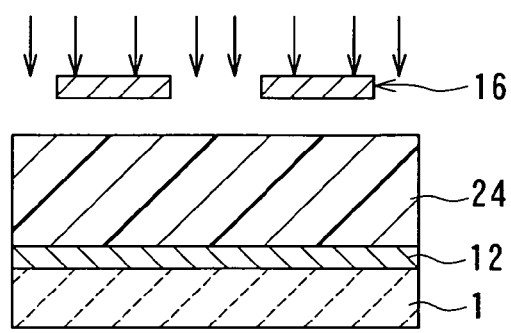
FIG. 12C                FIG. 12D

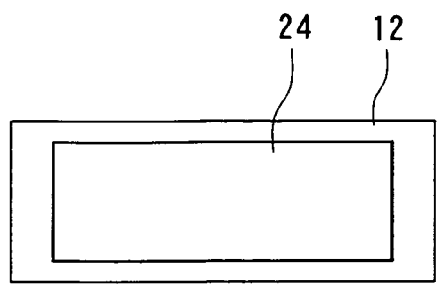
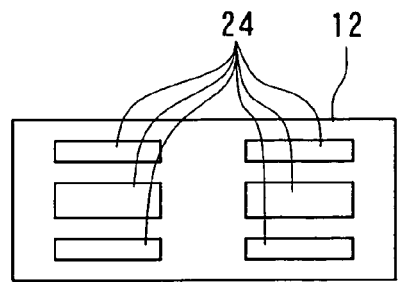
FIG. 14A  FIG. 14B
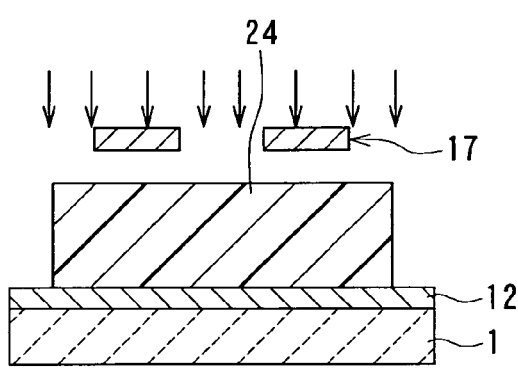
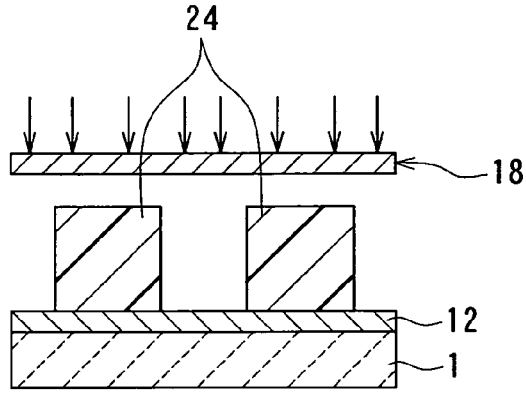
FIG. 14C  FIG. 14D

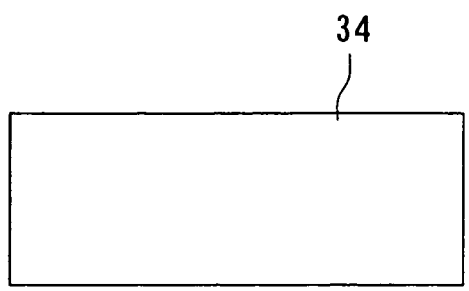
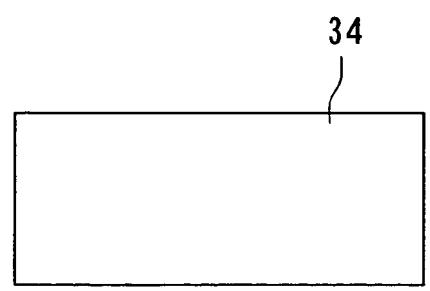
FIG. 18A                FIG. 18B
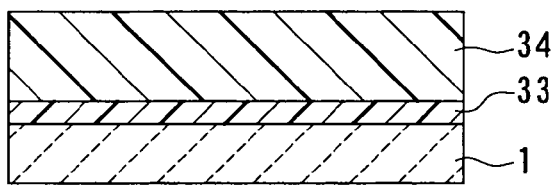
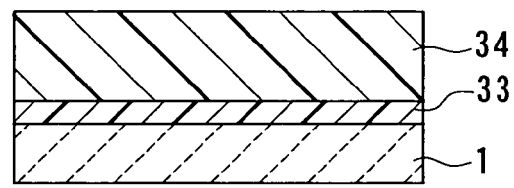
FIG. 18C                FIG. 18D

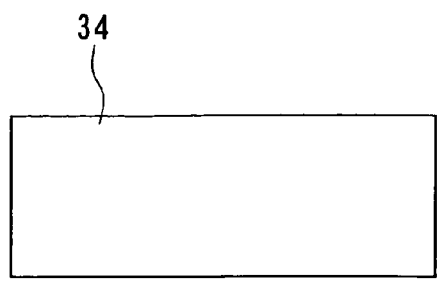
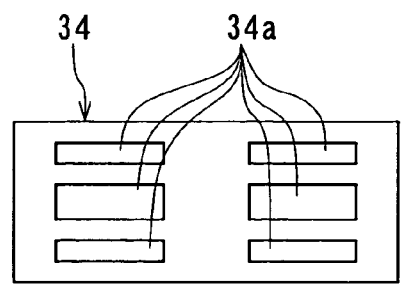
FIG. 21A    FIG. 21B
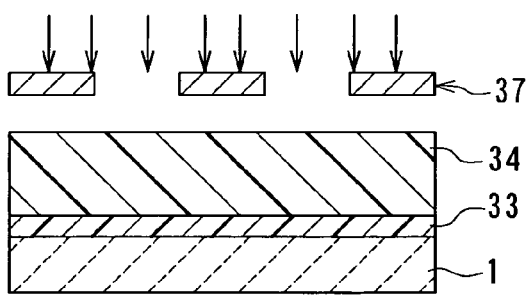
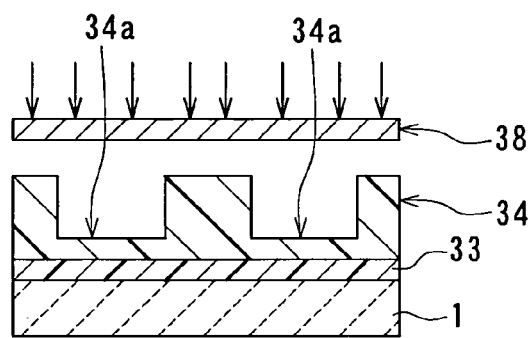
FIG. 21C    FIG. 21D

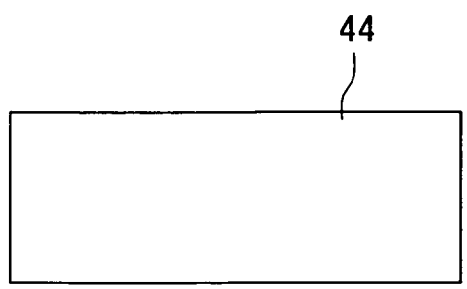
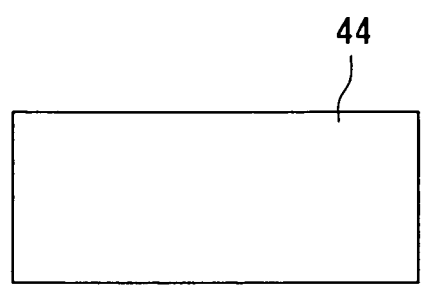
FIG. 28A          FIG. 28B
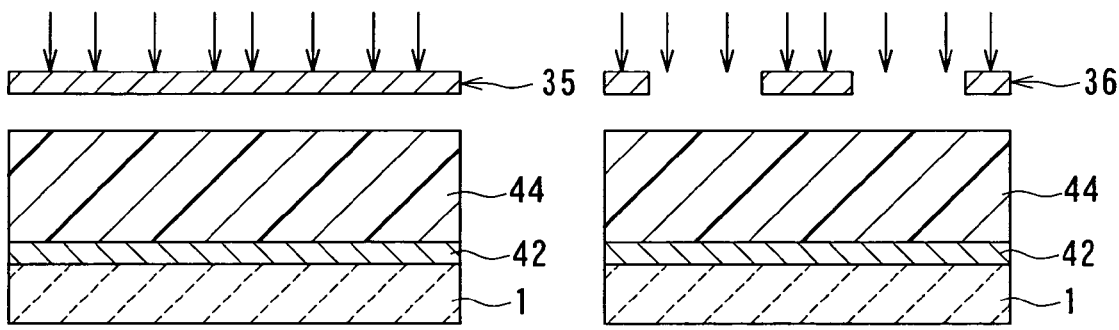
FIG. 28C          FIG. 28D

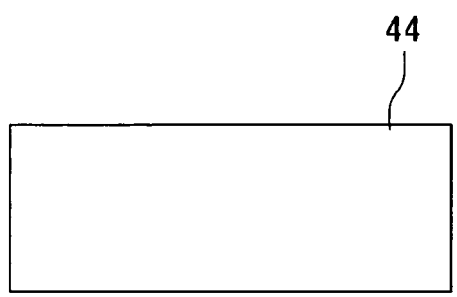
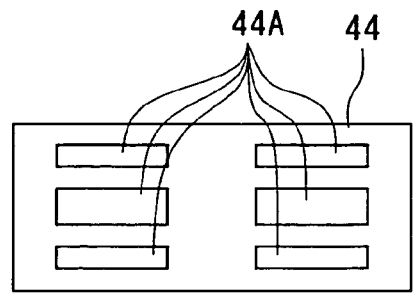
FIG. 30A　　　　　　　　FIG. 30B
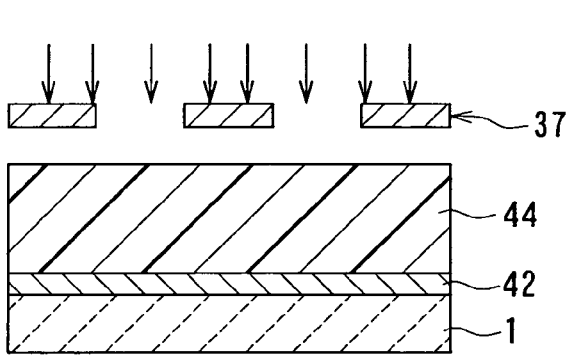
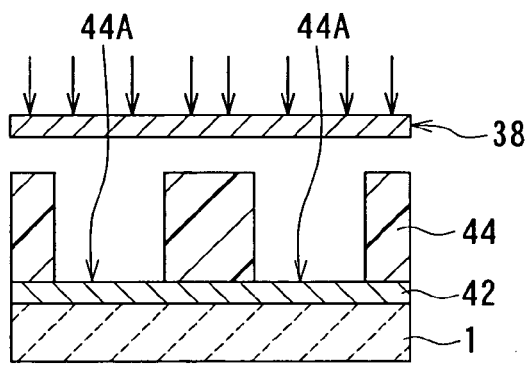
FIG. 30C　　　　　　　　FIG. 30D

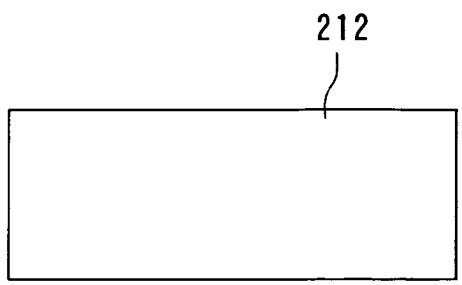
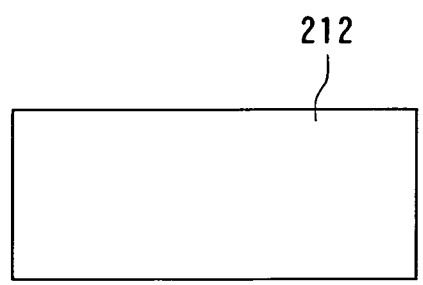
FIG. 35A
RELATED ART
FIG. 35B
RELATED ART
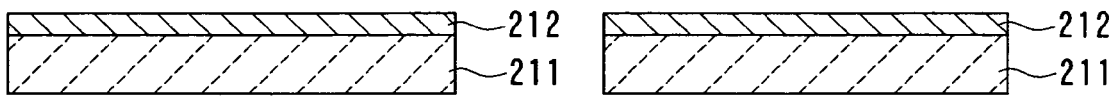
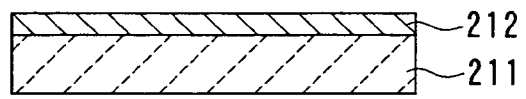
FIG. 35C
RELATED ART
FIG. 35D
RELATED ART

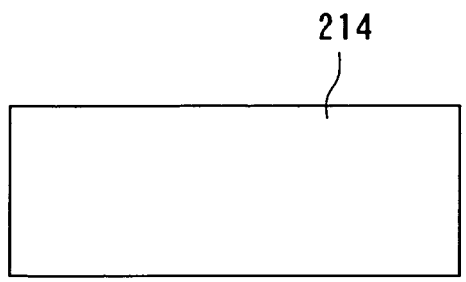
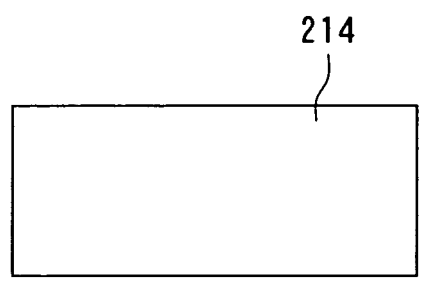
FIG. 36A
RELATED ART
FIG. 36B
RELATED ART
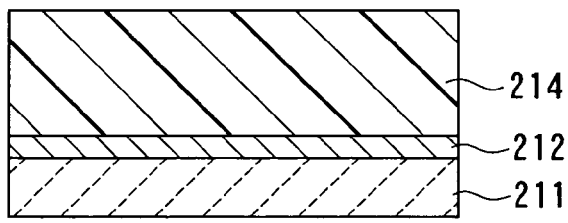
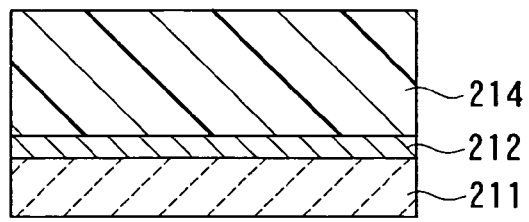
FIG. 36C
RELATED ART
FIG. 36D
RELATED ART

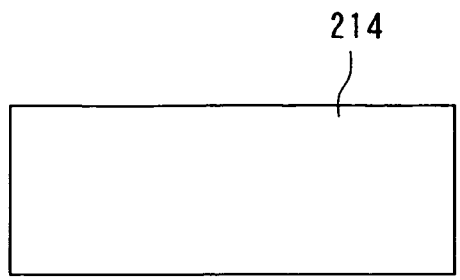 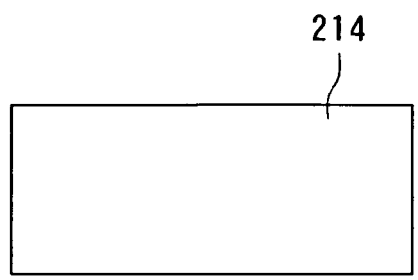
FIG. 37A
RELATED ART
FIG. 37B
RELATED ART
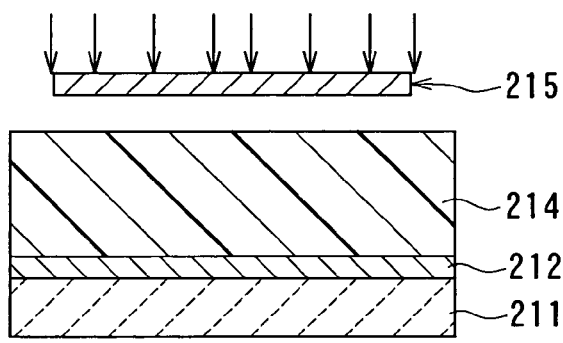 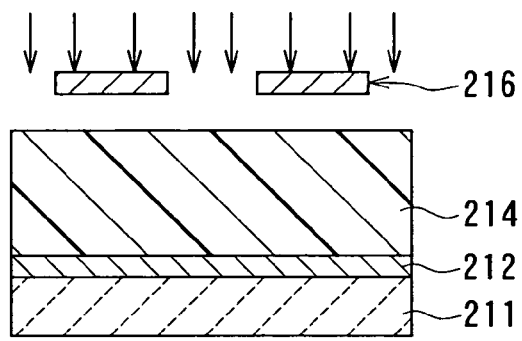
FIG. 37C
RELATED ART
FIG. 37D
RELATED ART

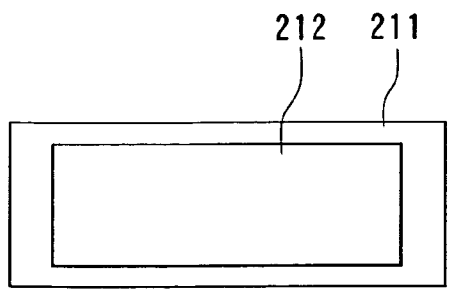
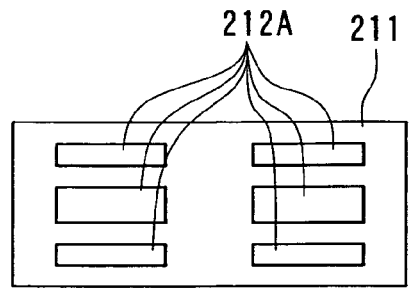
FIG. 40A
RELATED ART
FIG. 40B
RELATED ART
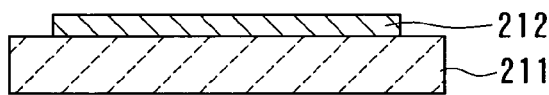
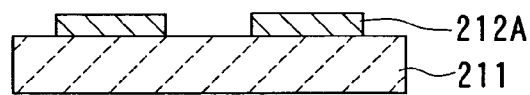
FIG. 40C
RELATED ART
FIG. 40D
RELATED ART

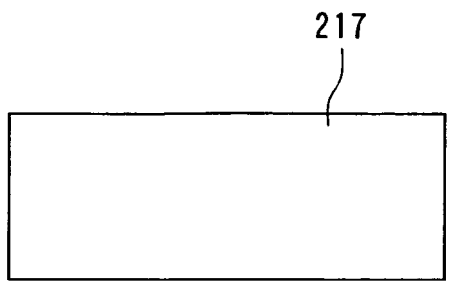
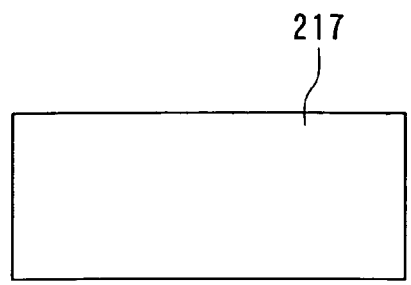
FIG. 41A
RELATED ART
FIG. 41B
RELATED ART
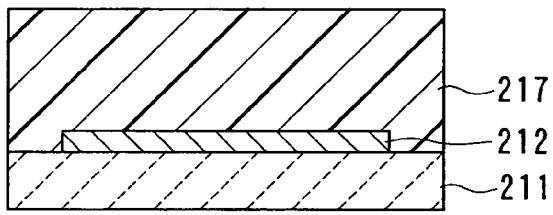
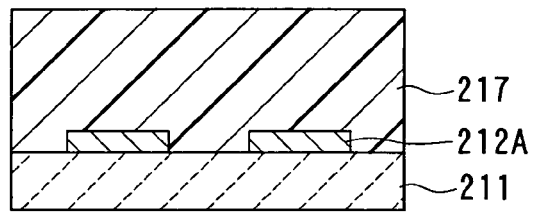
FIG. 41C
RELATED ART
FIG. 41D
RELATED ART

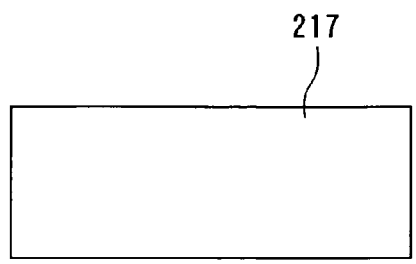
FIG. 42A
RELATED ART
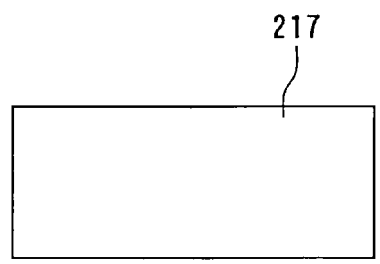
FIG. 42B
RELATED ART
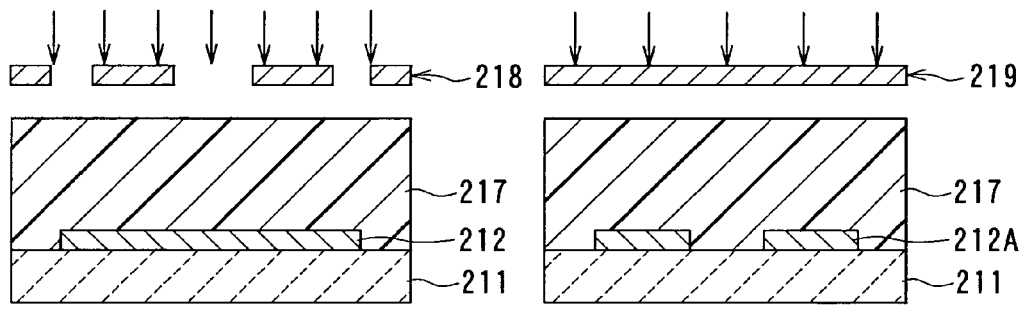
FIG. 42C
RELATED ART
FIG. 42D
RELATED ART

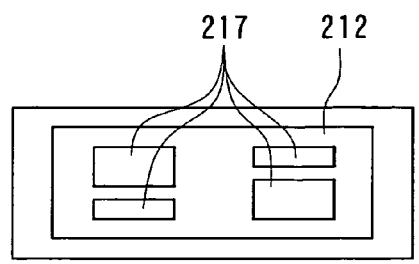
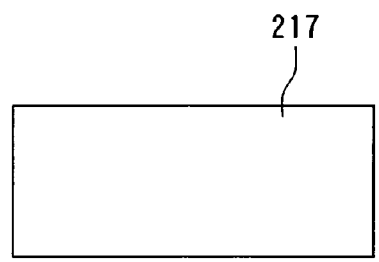
FIG. 43A
RELATED ART
FIG. 43B
RELATED ART
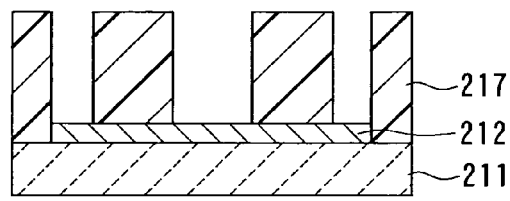
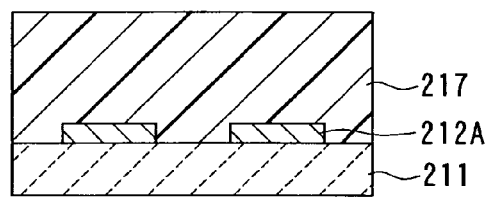
FIG. 43C
RELATED ART
FIG. 43D
RELATED ART

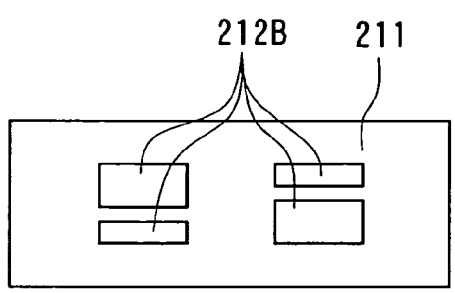
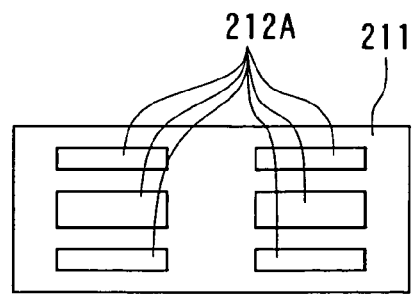
FIG. 45A
RELATED ART
FIG. 45B
RELATED ART
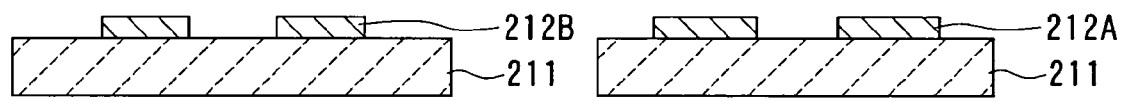
FIG. 45C
RELATED ART
FIG. 45D
RELATED ART

METHOD OF WRITING IDENTIFYING INFORMATION ON WAFER

BACKGROUND OF THE INVENTION

1. Field of the Invention

The present invention relates to a method of writing identifying information on a wafer, wherein the identifying information is written by photolithography on the wafer used for forming thin-film elements.

2. Description of the Related Art

Thin-film elements manufactured through thin-film forming techniques include those manufactured by forming a plurality of thin-film elements on a wafer (substrate) through the use of the thin-film forming techniques and then separating the wafer into the individual thin-film elements. Such thin-film elements include semiconductor elements and thin-film magnetic heads.

Typically, the above-mentioned thin-film elements are manufactured through a plurality of steps. In this case, in appropriate steps, alignment marks are formed on the wafer for alignment performed in the following step. Such alignment marks may be made of patterned films that are patterned through the use of photolithography, for example. Japanese Published Patent Application 2002-184672 discloses a technique in which alignment marks for a batch exposure apparatus and alignment marks for a reducing exposure apparatus are formed on a wafer in a first photolithography step.

Typically, wafer identifying information and element location identifying information are written on each of the above-mentioned thin-film elements for objectives such as process control and prevention of nonconforming products, wherein the wafer identifying information is used for identifying the wafer to which each of the thin-film elements belongs, and the element location identifying information is used for identifying the location of each of the thin-film elements on the wafer. These items of identification information are written on the wafer at a point before the wafer is divided into the respective thin-film elements. The identification information is also made of patterned films that are patterned through the use of photolithography, for example. Japanese Published Patent Application 62-20116 discloses a technique in which, on a wafer on which a plurality of thin-film magnetic heads are to be formed, marks for identifying the respective heads are formed in a batch by photolithography.

To write identifying information through the use of patterned films that are patterned through the use of photolithography, it is required to form the patterned films for identifying information at specific locations, using the alignment marks already formed as references indicating the locations. Consideration will now be given to a case in which identifying information is written on the wafer through the use of photolithography, using an alignment mark that is first formed (that may be hereinafter called the first alignment mark) as a reference indicating the location. This case may be one in which a patterned film for the first alignment mark and a patterned film for the identifying information are formed at the same heights by patterning a single thin film. In this case, according to the prior art, the patterned film for the first alignment mark is formed, and then a photolithography step for forming the patterned film for the identifying information is performed using the patterned film for the first alignment mark as the reference of the location.

The following is a description of an example of method of writing identifying information as a related-art method of writing identifying information, wherein the identifying information is written by photolithography using the first alignment mark as the reference of the location. FIG. 34 is a flowchart showing the related-art method of writing identifying information. FIG. 35A to FIG. 45A, FIG. 35B to FIG. 45B, FIG. 35C to FIG. 45C, and FIG. 35D to FIG. 45D are views for illustrating the steps of the method of writing identifying information of FIG. 34. FIG. 35A to FIG. 45A, FIG. 35B to FIG. 45B, FIG. 35C to FIG. 45C, and FIG. 35D to FIG. 45D each illustrate a state of a layered structure made up of a wafer and layers formed thereon. FIG. 35A to FIG. 45A each illustrate a top surface of a region in which the identifying information is to be located. FIG. 35B to FIG. 45B each illustrate a top surface of a region in which the first alignment mark is to be located. FIG. 35C to FIG. 45C each illustrate a cross section of the region in which the identifying information is to be located. FIG. 35D to FIG. 45D each illustrate a cross section of the region in which the first alignment mark is to be located. The region in which the identifying information is to be located may be a rectangular region, for example, surrounding the identifying information. Similarly, the region in which the first alignment mark is to be located may be a rectangular region, for example, surrounding the first alignment mark.

In the method of writing identifying information of FIG. 34, first, as shown in FIG. 35A to FIG. 35D, a metal film 212 is formed on the wafer 211 by sputtering, for example (step S201).

Next, as shown in FIG. 36A to FIG. 36D, a resist layer 214 is formed by applying a resist to the top of the metal film 212 (step S202). The resist used here may be positive one, for example.

Next, as shown in FIG. 37A to FIG. 37D, the resist layer 214 is exposed through masks 215 and 216 (step S203). The mask 215 is formed to intercept light in an entire region where the identifying information is to be located. The mask 216 is designed so that, in the region where the first alignment mark is to be located, light is intercepted in portions corresponding to the pattern of the first alignment mark, and light is allowed to pass through in the other portions.

Next, as shown in FIG. 38A to FIG. 38D, the resist layer 214 is developed (step S204). In the region where the identifying information is to be located, the resist layer 214 developed entirely remains. In the region where the first alignment mark is to be located, portions of the resist layer 214 developed that correspond to the pattern of the first alignment mark only remain. In FIG. 34 the steps surrounded by the broken line indicated with S21, that is, the steps from S202 to S204, are the photolithography steps for forming the first alignment mark.

Next, as shown in FIG. 39A to FIG. 39D, the metal film 212 is selectively etched, using the resist layer 214 as an etching mask (step S205). As a result, in the region where the identifying information is to be located, the metal film 212 entirely remains. In the region where the first alignment mark is to be located, portions of the metal film 212 that correspond to the pattern of the first alignment mark only remain. The portions of the metal film 212 remaining in the region where the first alignment mark is to be located become a patterned film 212A for the first alignment mark. Next, as shown in FIG. 40A to FIG. 40D, the resist layer 214 is removed (step S206).

Next, as shown in FIG. 41A to FIG. 41D, a resist layer 217 is formed by applying a resist to the entire top surface of the layered structure (step S207). The resist used here may be positive one, for example.

Next, as shown in FIG. 42A to FIG. 42D, the resist layer 217 is exposed through masks 218 and 219 (step S208). The mask 218 is designed so that, in the region where the identifying information is to be located, light is intercepted in portions corresponding to the pattern of the identifying information, and light is allowed to pass through in the other portions. The mask 219 is formed to intercept light in the entire region where the first alignment mark is to be located. In this step, the masks 218 and 219 are aligned using the patterned film 212A for the first alignment mark as the reference of the location.

Next, as shown in FIG. 43A to FIG. 43D, the resist layer 217 is developed (step S209). In the region where the identifying information is to be located, portions of the resist layer 217 developed that correspond to the pattern of the identifying information only remain. In the region where the first alignment mark is to be located, the resist layer 217 developed entirely remains. In FIG. 34 the steps surrounded by the broken line indicated with S22, that is, the steps from S207 to S209, are the photolithography steps for writing the identifying information.

Next, as shown in FIG. 44A to FIG. 44D, the metal film 212 is selectively etched, using the resist layer 217 as an etching mask (step S210). As a result, in the region where the identifying information is to be located, portions of the metal film 212 that correspond to the pattern of the identifying information only remain. These remaining portions of the metal film 212 become a patterned film 212B for the identifying information. In the region where the first alignment mark is to be located, the patterned film 212A remains as it is. Next, as shown in FIG. 45A to FIG. 45D, the resist layer 217 is removed (step S211), and the steps for writing the identifying information are thereby completed.

According to the related-art method of writing identifying information shown in FIG. 34, FIG. 35A to FIG. 45A, FIG. 35B to FIG. 45B, FIG. 35C to FIG. 45C, and FIG. 35D to FIG. 45D, there arises a problem that, since the method includes a great number of steps, a long period of time and costs are required for forming the patterned film for the first alignment mark and the patterned film for the identifying information.

OBJECT AND SUMMARY OF THE INVENTION

It is an object of the invention to provide a method of writing identifying information on a wafer that is capable of reducing the number of steps, wherein the identifying information is written by photolithography, using an alignment mark that is first formed as a reference of a location, on the wafer used for forming thin-film elements.

A method of writing identifying information on a wafer of the invention is provided for writing identifying information through the use of a patterned resist layer on a wafer used for forming thin-film elements. The method comprises: the step of forming a resist layer on the wafer; the first exposure step of exposing the resist layer based on a first pattern for an alignment mark by projecting the first pattern onto the resist layer; the first development step of developing the resist layer to form a pattern to be a reference of a location in the resist layer, the first development step being performed after the first exposure step; the second exposure step of exposing the resist layer based on a second pattern for the identifying information by projecting the second pattern onto the resist layer, using the pattern formed in the resist layer in the first development step as the reference of the location; the second development step of developing the resist layer to form a patterned resist layer after the second exposure step; and the patterned film forming step of forming a patterned film for the alignment mark that is patterned based on the first pattern and a patterned film for the identifying information that is patterned based on the second pattern, using the patterned resist layer.

The method of the invention may further comprise the step of forming a film to be etched that is located below the resist layer, the step being performed before the step of forming the resist layer, wherein, in the patterned film forming step, the film to be etched may be selectively etched, using the patterned resist layer as an etching mask, and the patterned film for the alignment mark and the patterned film for the identifying information may be thereby formed of remaining portions of the film etched.

In the method of the invention, the patterned resist layer may have a groove, and, in the patterned film forming step, the patterned film for the alignment mark and the patterned film for the identifying information may be formed by forming a film in the groove of the patterned resist layer.

In the method of the invention, in the first development step, development may be performed such that a part of a portion of the resist layer soluble in a developer remains, the part being close to the wafer.

In the method of the invention, in the first exposure step, a plurality of exposure regions may be predetermined on the wafer, and processing of projecting the first pattern onto the resist layer may be repeated for the respective exposure regions. In addition, in the second exposure step, processing of projecting the second pattern onto the resist layer may be repeated for the respective exposure regions. In this case, a plurality of element regions in each of which a thin-film element is to be formed may be predetermined in the exposure regions, and, in the second exposure step, exposure may be performed such that the second pattern is projected for each of the element regions.

In the method of the invention, the identifying information may include wafer identifying information for identifying the wafer. The identifying information may include element location identifying information for identifying a location of each of the thin-film elements in the wafer.

According to the method of writing identifying information on a wafer of the invention, in the first exposure step, the resist layer is exposed based on the first pattern for the alignment mark. In the first development step, the resist layer is developed and the pattern to be the reference of the location is thereby formed in the resist layer. In the second exposure step, the resist layer is exposed based on the second pattern for the identifying information by projecting the second pattern onto the resist layer, using the pattern formed in the resist layer in the first development step as the reference of the location. As a result, according to the invention, it is possible to reduce the number of steps in the case in which identifying information is written by photolithography, using an alignment mark that is first formed as the reference of the location, on a wafer used for forming thin-film elements.

Other and further objects, features and advantages of the invention will appear more fully from the following description.

BRIEF DESCRIPTION OF THE DRAWINGS

FIG. 3A to FIG. 3D are views for illustrating a step of the method of writing identifying information of the first embodiment of the invention.

FIG. 4A to FIG. 4D are views for illustrating a step that follows the step shown in FIG. 3A to FIG. 3D.

FIG. 8A to FIG. 8D are views for illustrating a step that follows the step shown in FIG. 7A to FIG. 7D.

FIG. 9A to FIG. 9D are views for illustrating a step that follows the step shown in FIG. 8A to FIG. 8D.

FIG. 10A to FIG. 10D are views for illustrating a step that follows the step shown in FIG. 9A to FIG. 9D.

FIG. 12A to FIG. 12D are views for illustrating a step that follows the step shown in FIG. 11A to FIG. 11D.

FIG. 14A to FIG. 14D are views for illustrating a step that follows the step shown in FIG. 13A to FIG. 13D.

FIG. 18A to FIG. 18D are views for illustrating a step of the method of writing identifying information of the third embodiment of the invention.

FIG. 21A to FIG. 21D are views for illustrating a step that follows the step shown in FIG. 20A to FIG. 20D.

FIG. 28A to FIG. 28D are views for illustrating a step that follows the step shown in FIG. 27A to FIG. 27D.

FIG. 30A to FIG. 30D are views for illustrating a step that follows the step shown in FIG. 29A to FIG. 29D.

FIG. 35A to FIG. 35D are views for illustrating a step of the method of writing identifying information of FIG. 34.

FIG. 36A to FIG. 36D are views for illustrating a step that follows the step shown in FIG. 35A to FIG. 35D.

FIG. 37A to FIG. 37D are views for illustrating a step that follows the step shown in FIG. 36A to FIG. 36D.

FIG. 40A to FIG. 40D are views for illustrating a step that follows the step shown in FIG. 39A to FIG. 39D.

FIG. 41A to FIG. 41D are views for illustrating a step that follows the step shown in FIG. 40A to FIG. 40D.

FIG. 42A to FIG. 42D are views for illustrating a step that follows the step shown in FIG. 41A to FIG. 41D.

FIG. 43A to FIG. 43D are views for illustrating a step that follows the step shown in FIG. 42A to FIG. 42D.

FIG. 45A to FIG. 45D are views for illustrating a step that follows the step shown in FIG. 44A to FIG. 44D.

DETAILED DESCRIPTION OF THE PREFERRED EMBODIMENTS

First Embodiment

Figure 1:
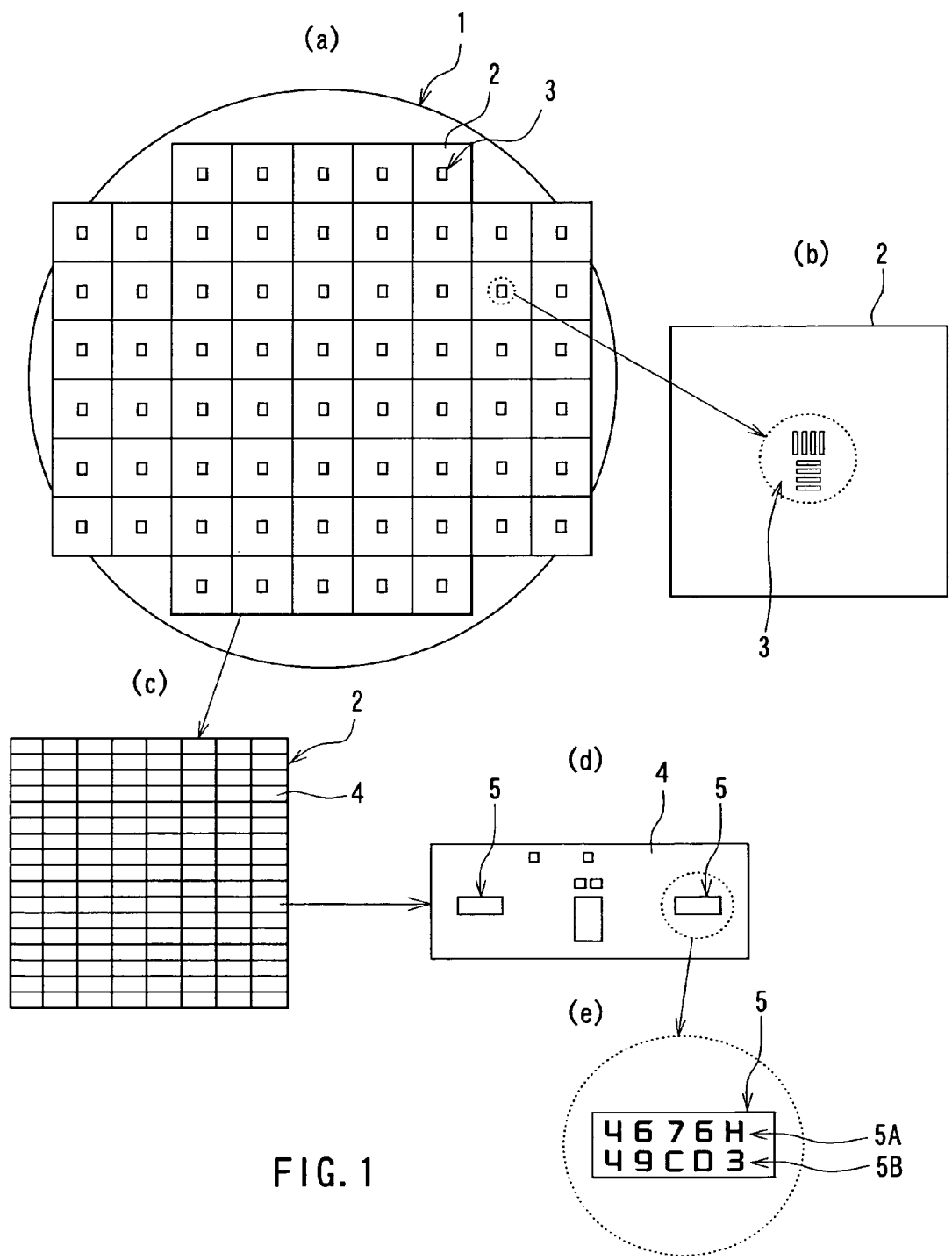
FIG. 1 is view for illustrating a wafer to which a first embodiment of the invention is applied.

Preferred embodiments of the invention will now be described in detail with reference to the accompanying drawings. Reference is now made to FIG. 1 to describe a wafer to which a method of writing identifying information on a wafer of a first embodiment of the invention is applied. FIG. 1 is a view for illustrating the wafer to which the first embodiment is applied. As shown in FIG. 1(a), a plurality of exposure regions 2 are predetermined on the wafer 1 to which the embodiment is applied. The exposure regions 2 are those in which a specific pattern is projected onto a resist layer described later by a single exposure processing. As shown in FIG. 1(b), an alignment mark 3 that is first formed is located in each of the exposure regions 2. As shown in FIG. 1(c), a plurality of element regions 4 in which respective thin-film elements are formed are predetermined in each of the exposure regions 2. The alignment mark 3 is located in a region of each of the exposure regions 2 that has an area equal to the area of several ones of the element regions 4, for example. The thin-film elements may be semiconductor elements or microdevices such as thin-film magnetic heads.

As shown in FIG. 1(d), identifying information 5 is written in each of the element regions 4. Although FIG. 1(d) illustrates an example in which the identifying information 5 is written at two points in the element region 4, the identifying information 5 may be written at one point in the element region 4 or three or more points in the element region 4. As shown in FIG. 1(e), the identifying information 5 includes wafer identifying information 5A for identifying the wafer 1, and element location identifying information 5B for identifying the location of each of the thin-film elements on the wafer 1. Each of the wafer identifying information 5A and the element location identifying information 5B includes a plurality of digits each of which is indicated with a numeral or an alphabet. The same wafer identifying information 5A is allocated to each of the element regions 4 on the wafer 1. On the other hand, different sorts of element location identifying information 5B are allocated to the respective element regions 4.

Figure 2:
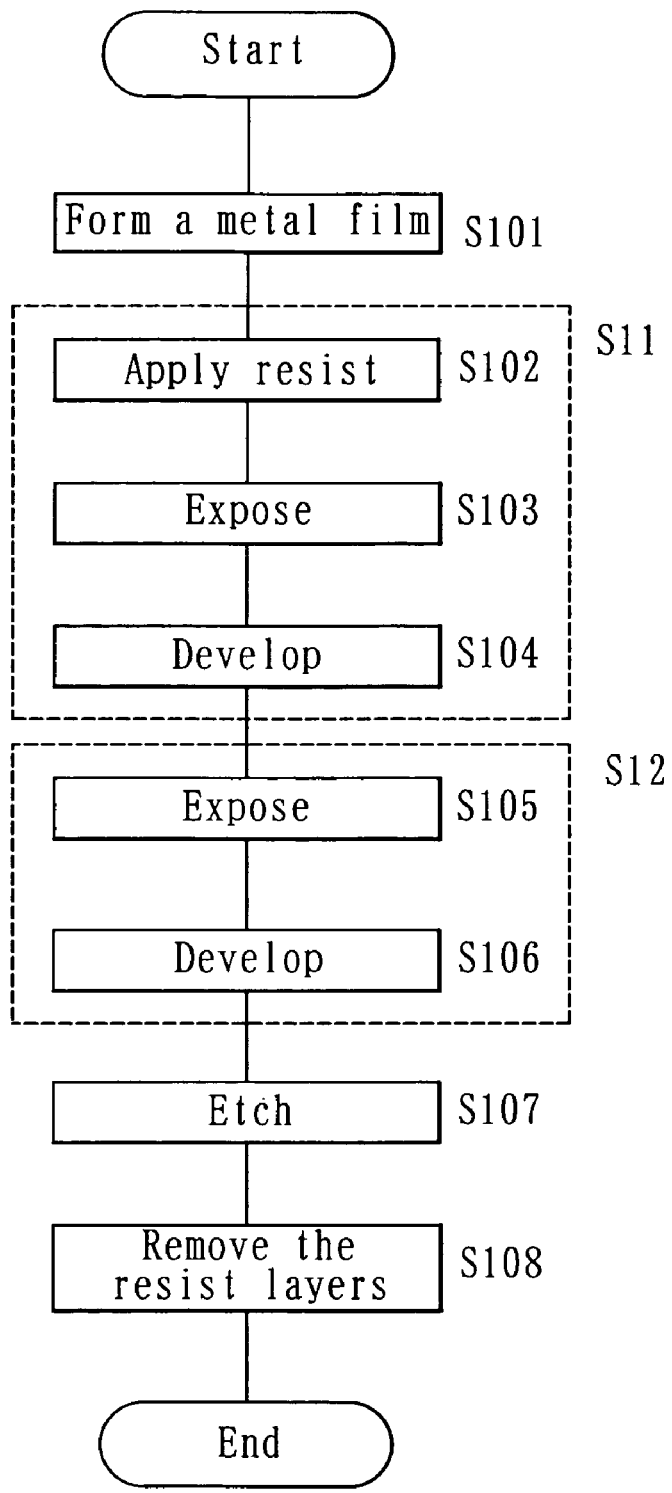
FIG. 2 is a flowchart showing a method of writing identifying information of the first embodiment of the invention.
Figure 5A:
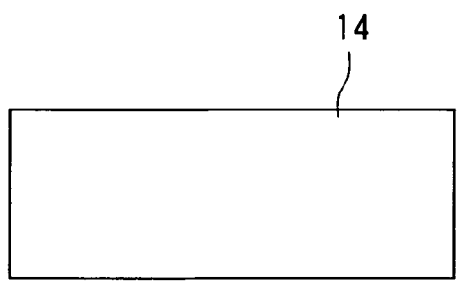
FIG. 5A to FIG. 5D are views for illustrating a step that follows the step shown in FIG. 4A to FIG. 4D.
Figure 5B:
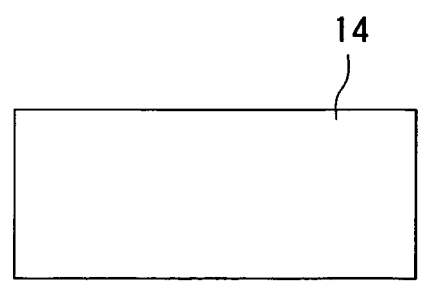
Figure 5C:
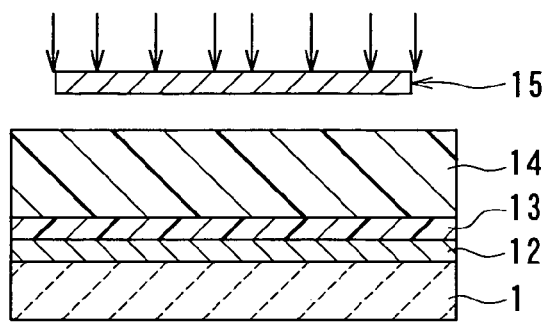
Figure 5D:
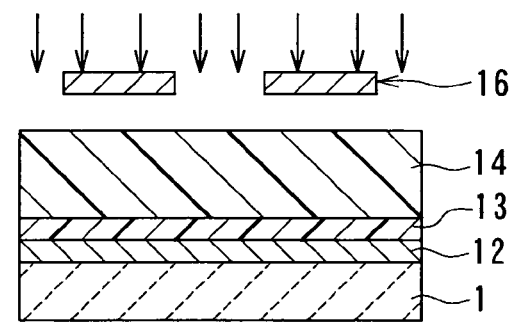
Figure 6A:
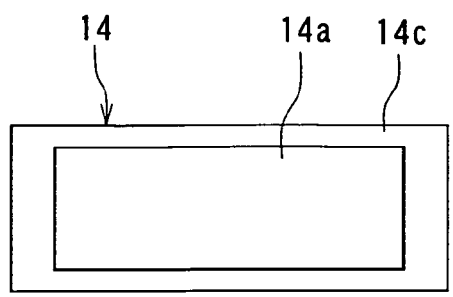
FIG. 6A to FIG. 6D are views for illustrating a step that follows the step shown in FIG. 5A to FIG. 5D.
Figure 6B:
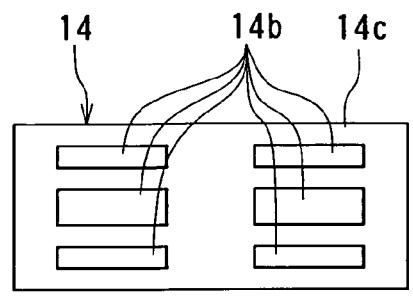
Figure 6C:
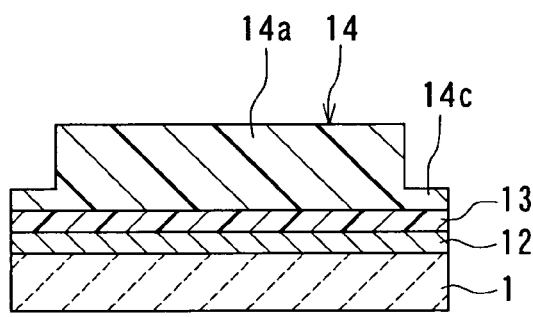
Figure 6D:
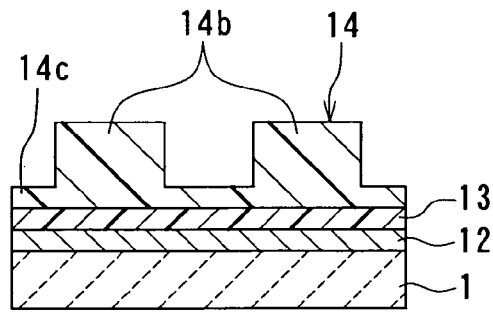
Figure 7A:
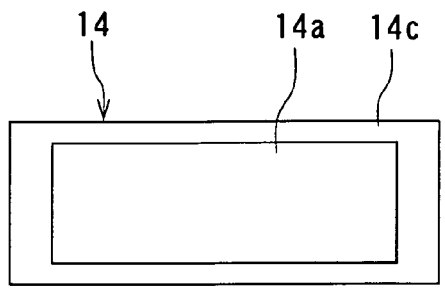
FIG. 7A to FIG. 7D are views for illustrating a step that follows the step shown in FIG. 6A to FIG. 6D.
Figure 7B:
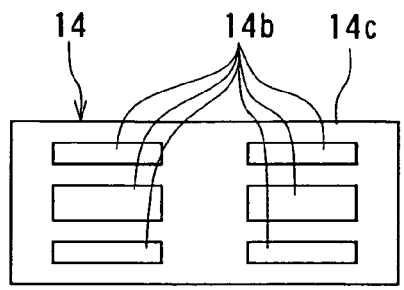
Figure 7C:
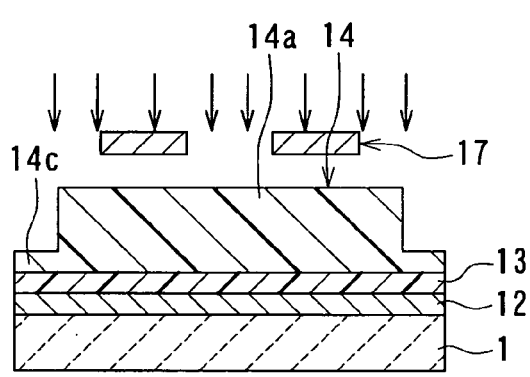
Figure 7D:
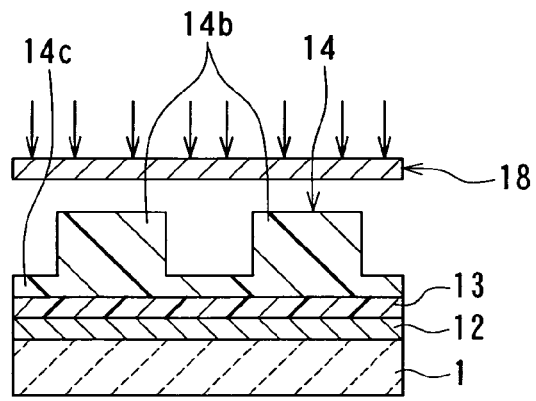
Figure 11A:
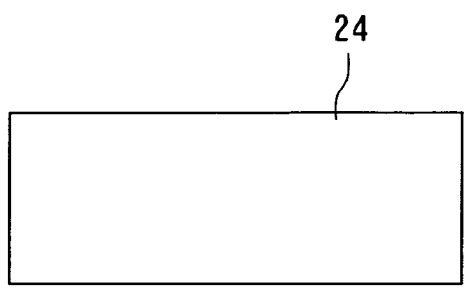
FIG. 11A to FIG. 11D are views for illustrating a step of a method of writing identifying information of a second embodiment of the invention.
Figure 11B:
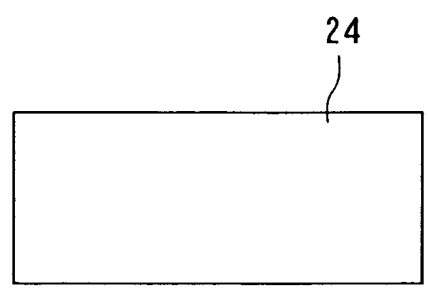
Figure 11C:
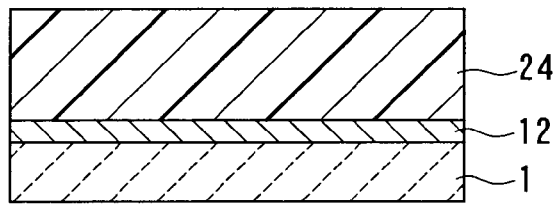
Figure 11D:
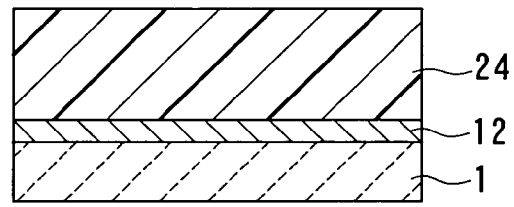
Figure 13A:
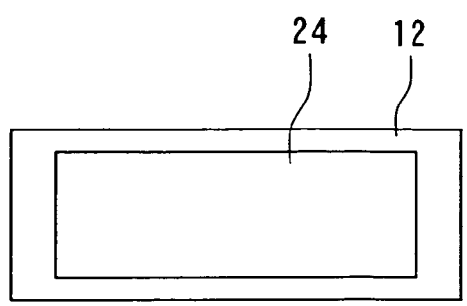
FIG. 13A to FIG. 13D are views for illustrating a step that follows the step shown in FIG. 12A to FIG. 12D.
Figure 13B:
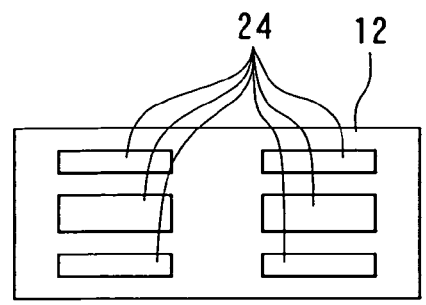
Figure 13C:
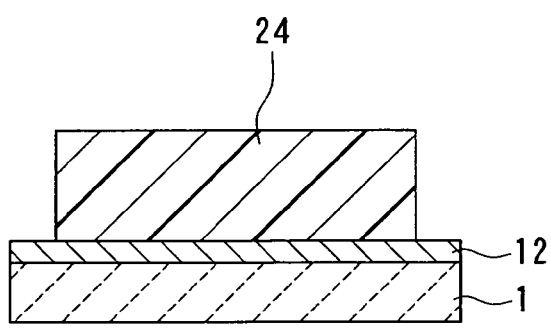
Figure 13D:
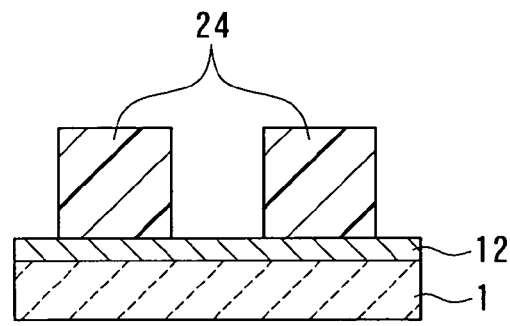
Figure 15A:
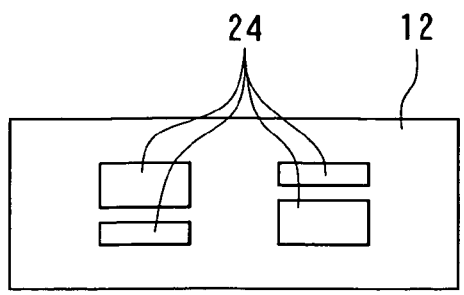
FIG. 15A to FIG. 15D are views for illustrating a step that follows the step shown in FIG. 14A to FIG. 14D.
Figure 15B:
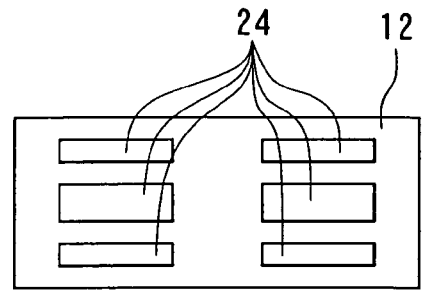
Figure 15C:
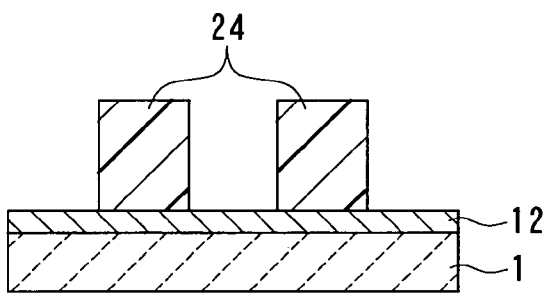
Figure 15D:
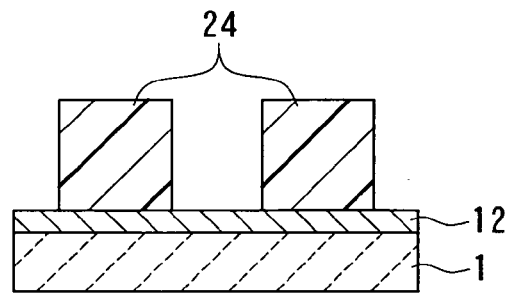
Figure 16A:
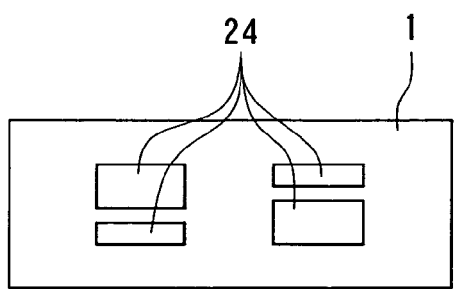
FIG. 16A to FIG. 16D are views for illustrating a step that follows the step shown in FIG. 15A to FIG. 15D.
Figure 16B:
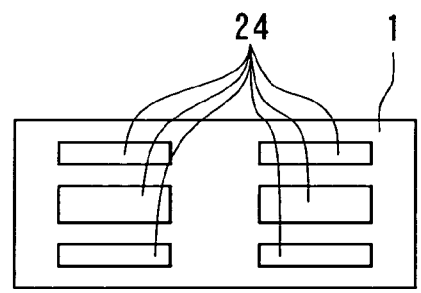
Figure 16C:
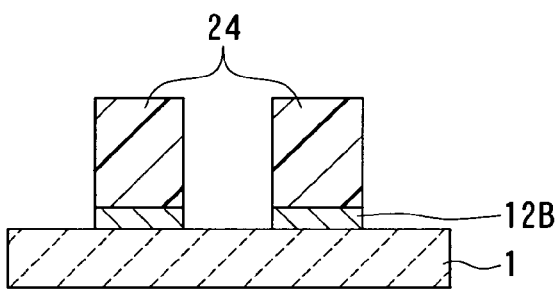
Figure 16D:
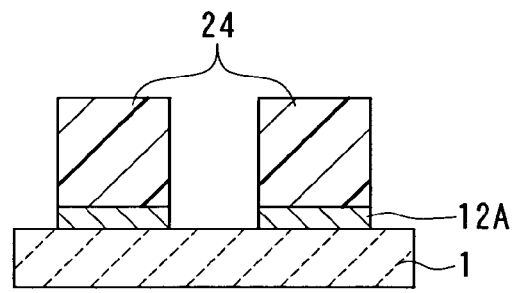

Reference is now made to FIG. 2, FIG. 3A to FIG. 10A, FIG. 3B to FIG. 10B, FIG. 3C to FIG. 10C, and FIG. 3D to FIG. 10D to describe the method of writing the identifying information on the wafer of the embodiment. The method of the embodiment is one for writing the identifying information 5 on the wafer 1 for forming thin-film elements, using patterned resist layers. FIG. 2 is a flowchart showing the method of writing the identifying information of the embodiment. FIG. 3A to FIG. 10A, FIG. 3B to FIG. 10B, FIG. 3C to FIG. 10C, and FIG. 3D to FIG. 10D are views for illustrating the steps of the method. FIG. 3A to FIG. 10A, FIG. 3B to FIG. 10B, FIG. 3C to FIG. 10C, and FIG. 3D to FIG. 10D each illustrate a state of a layered structure made up of the wafer 1 and layers formed thereon. FIG. 3A to FIG. 10A each illustrate a top surface of a region in which the identifying information 5 is to be located. FIG. 3B to FIG. 10B each illustrate a top surface of a region in which the alignment mark 3 is to be located. FIG. 3C to FIG. 10C each illustrate a cross section of the region in which the identifying information 5 is to be located. FIG. 3D to FIG. 10D each illustrate a cross section of the region in which the alignment mark 3 is to be located. The region in which the identifying information 5 is to be located may be a rectangular region, for example, surrounding the identifying information 5. Similarly, the region in which the alignment mark 3 is to be located may be a rectangular region, for example, surrounding the alignment mark 3.

In the method of writing the identifying information of the embodiment, first, as shown in FIG. 3A to FIG. 3D, a metal film 12 as a film to be etched is formed on the wafer 1 by sputtering, for example (step S101). The metal film 12 may be made of any metal material that is not transparent, such as Ti.

Next, as shown in FIG. 4A to FIG. 4D, two resist layers 13 and 14 are formed by applying two kinds of resists to the top of the metal film 12 one by one (step S102). The resist layer 13 is the lower one and the resist layer 14 is the upper one. Although an example is given here in which the resists forming the resist layers 13 and 14 are positive ones, the resists may be negative ones. The lower resist layer 13 may be one that is not photosensitive as long as it is soluble in a developer. Although FIG. 4A to FIG. 4D show the example in which the two resist layers 13 and 14 are formed, a single resist layer may be formed by applying one kind of resist to the top of the metal film 12.

Next, as shown in FIG. 5A to FIG. 5D, the resist layers 13 and 14 are exposed through masks 15 and 16 (step S103). The mask 15 is formed to intercept light in an entire region where the identifying information 5 is to be located. The mask 16 has a first pattern for the alignment mark 3. That is, the mask 16 is designed so that, in the region where the alignment mark 3 is to be located, light is intercepted in portions corresponding to the pattern of the alignment mark 3, and light is allowed to pass through in the other portions. In this step, the first pattern for the alignment mark 3 is projected onto the resist layers 13 and 14, and the resist layers 13 and 14 are thereby exposed based on the first pattern. This step is performed for each of the exposure regions 2 and repeated until exposure of all the exposure regions 2 is completed. This step corresponds to the first exposure step of the invention.

Next, as shown in FIG. 6A to FIG. 6D, the resist layers 13 and 14 are developed to form a pattern to be a reference of a location (step S104). This step corresponds to the first development step of the invention. In the embodiment, development is performed such that parts of portions of the resist layers 13 and 14 soluble in the developer remain, the parts being close to the wafer 1. If the resists forming the resist layers 13 and 14 are positive, the portions to which light for exposure is applied become soluble in the developer. If the resists forming the resist layers 13 and 14 are negative, the portions to which light for exposure is not applied become soluble in the developer.

It is possible to perform development such that the parts close to the wafer 1 of the portions of the resist layers 13 and 14 soluble in the developer remain, by adjusting the development time, adjusting the magnitude of exposure in the step S103, and adjusting the temperature at which prebake or bake before development of the resist layers 13 and 14 is performed, for example.

FIG. 6A to FIG. 6D show an example in which development is performed such that the entire resist layer 13 touching the metal film 12 and a part of the resist layer 14 close to the wafer 1 remain. In this example, the resist layer 14 developed has: a convex portion 14a located in the entire region where the identifying information 5 is to be located; a convex portion 14b having a shape corresponding to the pattern of the alignment mark 3 and located in the region where the alignment mark 3 is to be located; and a lower portion 14c other than the convex portions 14a and 14b. The top surface of the lower portion 14c is located at a level lower than the top surfaces of the convex portions 14a and 14b (a level closer to the top surface of the wafer 1). Thus, there is a difference in level between the lower portion 14c and the convex portions 14a and 14b. This difference in level makes it possible to recognize the location and shape of the convex portion 14b by observing the convex portion 14b with a microscope, for example. In the embodiment the pattern of the convex portion 14b is the one that serves as the reference of the location. In FIG. 2 the steps surrounded by the broken line indicated with S11, that is, the steps from S102 to S104, are the photolithography steps for forming the alignment mark 3.

Next, as shown in FIG. 7A to FIG. 7D, the resist layers 13 and 14 are exposed through masks 17 and 18 (step S105). The mask 17 has a second pattern for the identifying information 5. That is, the mask 17 is designed so that, in the region where the identifying information 5 is to be located, light is intercepted in portions corresponding to the pattern of the identifying information 5, and light is allowed to pass through in the other portions. The mask 18 is formed to intercept light in the entire region where the alignment mark 3 is to be located. In this step, the second pattern for the identifying information 5 is projected onto the resist layers 13 and 14, and the resist layers 13 and 14 are thereby exposed based on the second pattern. Since the identifying information 5 includes the wafer identifying information 5A and the element location identifying information 5B, the resist layers 13 and 14 are actually multi-exposed based on the pattern for the wafer identifying information 5A and the pattern for the element location identifying information 5B. This step is performed for each of the exposure regions 2 and repeated until exposure of all the exposure regions 2 is completed. In this step, exposure is performed such that the second pattern for the identifying information 5 is projected for each of the element regions 4. This step corresponds to the second exposure step of the invention.

Projection of the second pattern onto the resist layers 13 and 14 is performed using the pattern formed in the resist layer 14 in the development step of the step S104, that is, the pattern of the convex portion 14b, as the reference of the location. That is, the masks 17 and 18 are aligned using the pattern formed in the resist layer 14 in the development step of the step S104, that is, the pattern of the convex portion 14b, as the reference of the location. The convex portion 14b has a shape corresponding to the pattern of the alignment mark 3. Therefore, although the alignment mark 3 is not formed yet at this point, it is possible to align the masks 17 and 18 in a manner similar to the case in which alignment is performed using the alignment mark 3 as the reference of the location after the alignment mark 3 is formed.

Next, as shown in FIG. 8A to FIG. 8D, the resist layers 13 and 14 are developed to form the patterned resist layers 13 and 14 (step S106). In the region where the identifying information 5 is to be located, portions of the resist layers 13 and 14 developed that correspond to the pattern of the identifying information 5 only remain. In the region where the alignment mark 3 is to be located, portions of the resist layers 13 and 14 developed that correspond to the pattern of the alignment mark 3 only remain. FIG. 8A to FIG. 8D show an example in which the width of the resist layer 13 is smaller than that of the resist layer 14 so that the layered structure made up of the resist layers 13 and 14 has a shape with undercuts. This step corresponds to the second development step of the invention. In FIG. 2 the steps surrounded by the broken line indicated with S12, that is, the steps S105 and S106, are the photolithography steps for writing the identifying information 5.

Next, as shown in FIG. 9A to FIG. 9D, the metal film 12 is selectively etched by ion milling, for example, using the resist layers 13 and 14 as etching masks (step S107). As a result, in the region in which the alignment mark 3 is to be located, portions of the metal film 12 that correspond to the pattern of the alignment mark 3 only remain. These remaining portions of the metal film 12 become a patterned film 12A indicating the alignment mark 3. In the region where the identifying information 5 is to be located, portions of the metal film 12 that correspond to the pattern of the identifying information 5 only remain. These remaining portions of the metal film 12 become a patterned film 12B indicating the identifying information 5. In this step, in the manner thus described, the patterned film 12A for the alignment mark 3 and the patterned film 12B for the identifying information 5 are formed through the use of the patterned resist layers 13 and 14, wherein the patterned film 12A is patterned based on the first pattern while the patterned film 12B is patterned based on the second pattern. This step corresponds to the patterned film forming step of the invention. In the embodiment the patterned films 12A and 12B are formed at the same height, using the same metal film 12. The method of etching the metal film 12 is not limited to ion milling but may be any sort of dry etching such as reactive ion etching.

Next, as shown in FIG. 10A to FIG. 10D, the resist layers 13 and 14 are removed (step S108), and the steps for writing the identifying information 5 are thereby completed. The alignment mark 3 is used as the reference of the location in the photolithography steps performed after the alignment mark 3 is formed.

Figure 34:
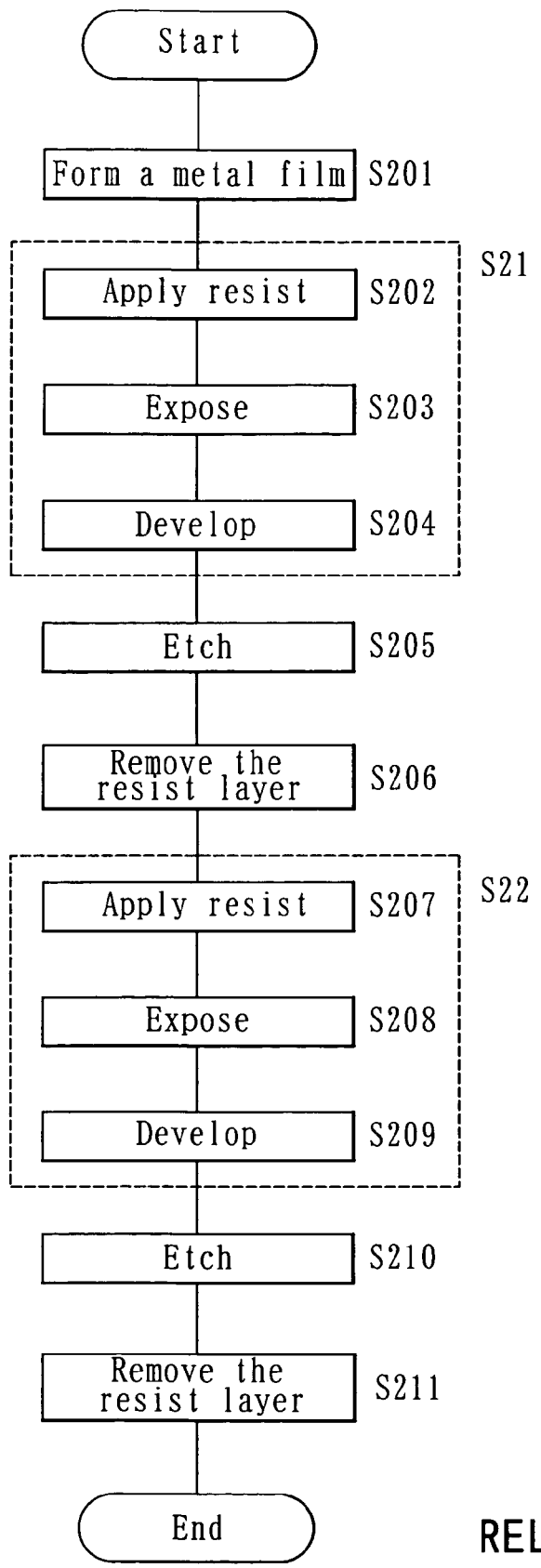
FIG. 34 is a flowchart showing a method of writing identifying information of related art.
Figure 38A:
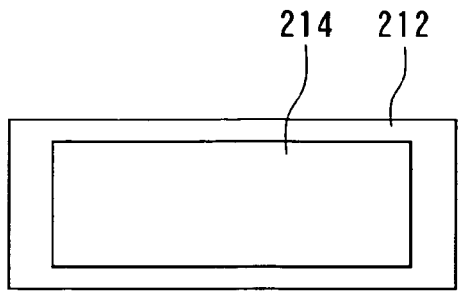
FIG. 38A to FIG. 38D are views for illustrating a step that follows the step shown in FIG. 37A to FIG. 37D.
Figure 38B:
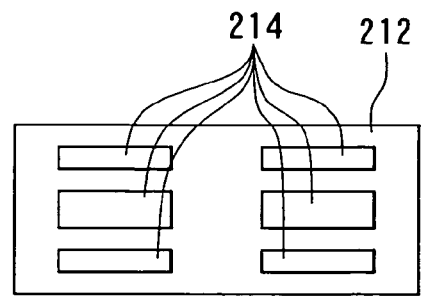
Figure 38C:
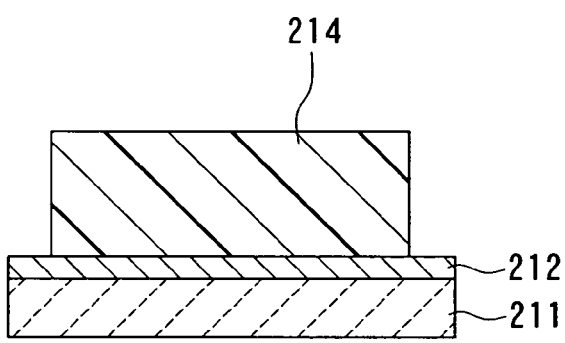
Figure 38D:
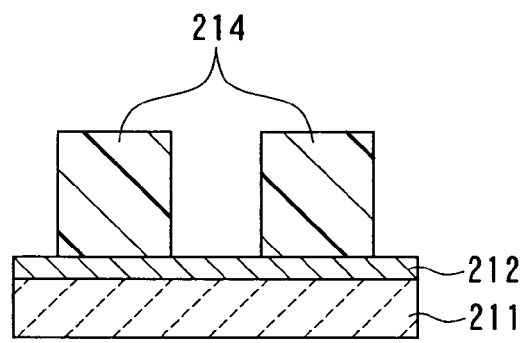
Figure 39A:
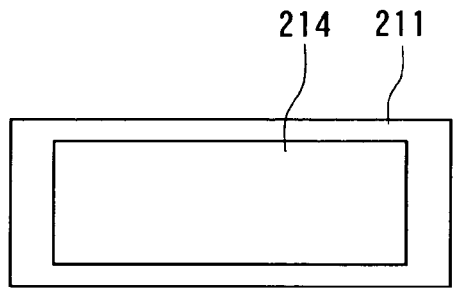
FIG. 39A to FIG. 39D are views for illustrating a step that follows the step shown in FIG. 38A to FIG. 38D.
Figure 39B:
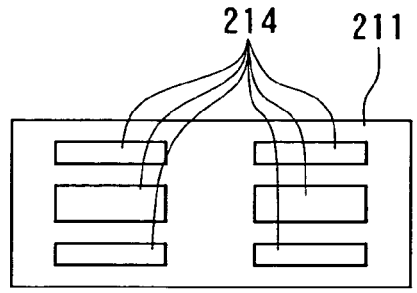
Figure 39C:
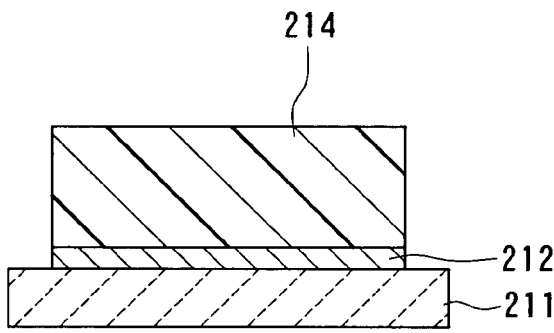
Figure 39D:
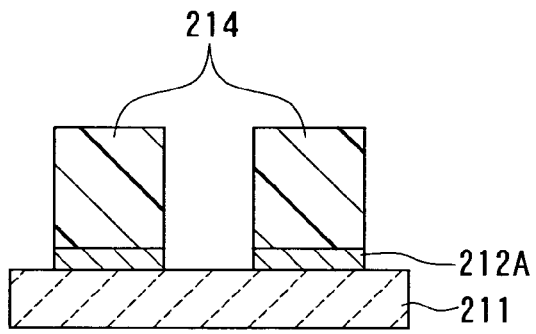
Figure 44A:
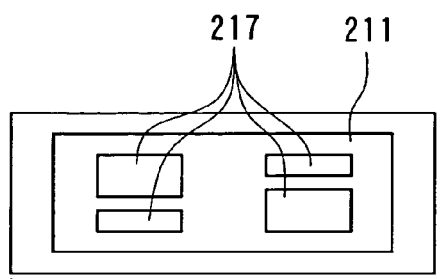
FIG. 44A to FIG. 44D are views for illustrating a step that follows the step shown in FIG. 43A to FIG. 43D.
Figure 44B:
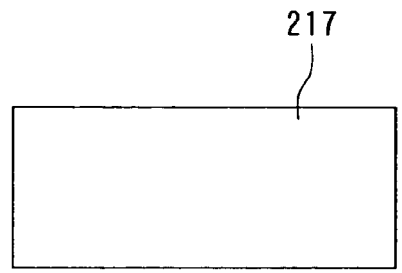
Figure 44C:
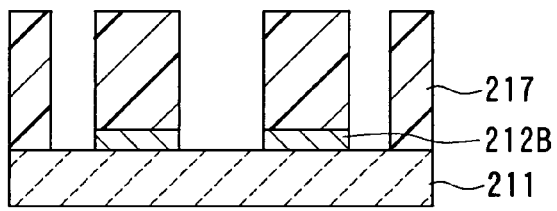
Figure 44D:
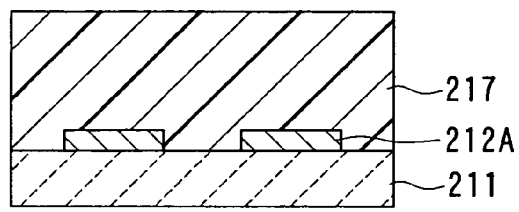

As a comparison between FIG. 2 and FIG. 34 indicates, the embodiment does not require the etching step of the step S205 of FIG. 34, the step of removing the resist layer of the step S206, and the step of applying resist of the step S207. As a result, according to the embodiment, it is possible to reduce the number of steps required when the identifying information 5 is written by photolithography on the wafer 1 for forming thin-film elements, using the alignment mark 3 that is first formed as the reference of the location. According to the embodiment, it is also possible to reduce amounts of resist and developer used. These features of the embodiment make it possible to reduce the time and costs required for writing the identifying information 5.

Second Embodiment

Reference is now made to FIG. 2, FIG. 11A to FIG. 16A, FIG. 11B to FIG. 16B, FIG. 11C to FIG. 16C, and FIG. 11D to FIG. 16D to describe a method of writing identifying information of a second embodiment of the invention. FIG. 11A to FIG. 16A, FIG. 11B to FIG. 16B, FIG. 11C to FIG. 16C, and FIG. 11D to FIG. 16D are views for illustrating the steps of the method. FIG. 11A to FIG. 16A, FIG. 11B to FIG. 16B, FIG. 11C to FIG. 16C, and FIG. 11D to FIG. 16D each illustrate a state of a layered structure made up of the wafer 1 and layers formed thereon. FIG. 11A to FIG. 16A each illustrate a top surface of a region in which the identifying information 5 is to be located. FIG. 11B to FIG. 16B each illustrate a top surface of a region in which the alignment mark 3 is to be located. FIG. 1C to FIG. 16C each illustrate a cross section of the region in which the identifying information 5 is to be located. FIG. 11D to FIG. 16D each illustrate a cross section of the region in which the alignment mark 3 is to be located.

The method of writing the identifying information of the second embodiment includes the step of forming the metal film 12 as a film to be etched on the wafer 1 (step S101), as shown in FIG. 3A to FIG. 3D, that is the same as that of the first embodiment.

FIG. 11A to FIG. 11D illustrate the following step. In the step, a resist layer 24 is formed by applying resist to the top of the metal film 12 (step S102). Although an example is given here in which the resist forming the resist layer 24 is positive one, the resist may be negative one.

Next, as shown in FIG. 12A to FIG. 12D, the resist layer 24 is exposed through the masks 15 and 16 (step S103). The masks 15 and 16 are the same as those of the first embodiment. In this step, the first pattern for the alignment mark 3 that the mask 16 has is projected onto the resist layer 24, and the resist layer 24 is thereby exposed based on the first pattern. This step is performed for each of the exposure regions 2 and repeated until exposure of all the exposure regions 2 is completed. This step corresponds to the first exposure step of the invention.

Next, as shown in FIG. 13A to FIG. 13D, the resist layer 24 is developed (step S104). This step corresponds to the first development step of the invention. In the embodiment, development is performed such that portions of the resist layer 24 soluble in the developer are all removed. If the resist forming the resist layer 24 is positive, portions to which light for exposure is applied become soluble in the developer. If the resist forming the resist layer 24 is negative, portions to which light for exposure is not applied become soluble in the developer.

The resist layer 24 developed entirely remains in the region where the identifying information 5 is to be located. Portions of the resist layer 24 developed that correspond to the pattern of the alignment mark 3 only remain in the region where the alignment mark 3 is to be located. In this region it is possible to recognize the location and shape of the resist layer 24 by observing the resist layer 24 with a microscope, for example.

Next, as shown in FIG. 14A to FIG. 14D, the resist layer 24 is exposed through the masks 17 and 18 (step S105). The masks 17 and 18 are the same as those of the first embodiment. In this step, the second pattern for the identifying information 5 that the mask 17 has is projected onto the resist layer 24, and the resist layer 24 is thereby exposed based on the second pattern. Since the identifying information 5 includes the wafer identifying information 5A and the element location identifying information 5B, the resist layer 24 is actually multi-exposed based on the pattern for the wafer identifying information 5A and the pattern for the element location identifying information 5B. This step is performed for each of the exposure regions 2 and repeated until exposure of all the exposure regions 2 is completed. This step corresponds to the second exposure step of the invention.

Projection of the second pattern onto the resist layer 24 is performed using the pattern formed in the resist layer 24 in the development step of the step S104, that is, the pattern of the resist layer 24 in the region where the alignment mark 3 is to be located, as the reference of the location. That is, the masks 17 and 18 are aligned using the pattern formed in the resist layer 24 in the development step of the step S104 as the reference of the location. The resist layer 24 in the region where the alignment mark 3 is to be located has a shape corresponding to the pattern of the alignment mark 3. Therefore, although the alignment mark 3 is not formed yet at this point, it is possible to align the masks 17 and 18 in a manner similar to the case in which alignment is performed using the alignment mark 3 as the reference of the location after the alignment mark 3 is formed.

Next, as shown in FIG. 15A to FIG. 15D, the resist layer 24 is developed to form the patterned resist layer 24 (step S106). In the region where the identifying information 5 is to be located, portions of the resist layer 24 developed that correspond to the pattern of the identifying information 5 only remain. In the region where the alignment mark 3 is to be located, portions of the resist layer 24 developed that correspond to the pattern of the alignment mark 3 only remain. This step corresponds to the second development step of the invention.

Next, as shown in FIG. 16A to FIG. 16D, the metal film 12 is selectively etched by ion milling, for example, using the resist layer 24 as an etching mask (step S107). As a result, in the region where the alignment mark 3 is to be located, portions of the metal film 12 that correspond to the pattern of the alignment mark 3 only remain. These remaining portions of the metal film 12 become the patterned film 12A indicating the alignment mark 3. In the region where the identifying information 5 is to be located, portions of the metal film 12 that correspond to the pattern of the identifying information 5 only remain. These remaining portions of the metal film 12 become the patterned film 12B indicating the identifying information 5. In this step, in the manner thus described, the patterned film 12A for the alignment mark 3 and the patterned film 12B for the identifying information 5 are formed through the use of the patterned resist layer 24, wherein the patterned film 12A is patterned based on the first pattern while the patterned film 12B is patterned based on the second pattern. The method of etching the metal film 12 is not limited to ion milling but may be any sort of dry etching such as reactive ion etching. Next, the resist layer 24 is removed (step S108), and the steps for writing the identifying information 5 are thereby completed.

The remainder of configuration, function and effect of the second embodiment are similar to those of the first embodiment.

Third Embodiment

Figure 17:
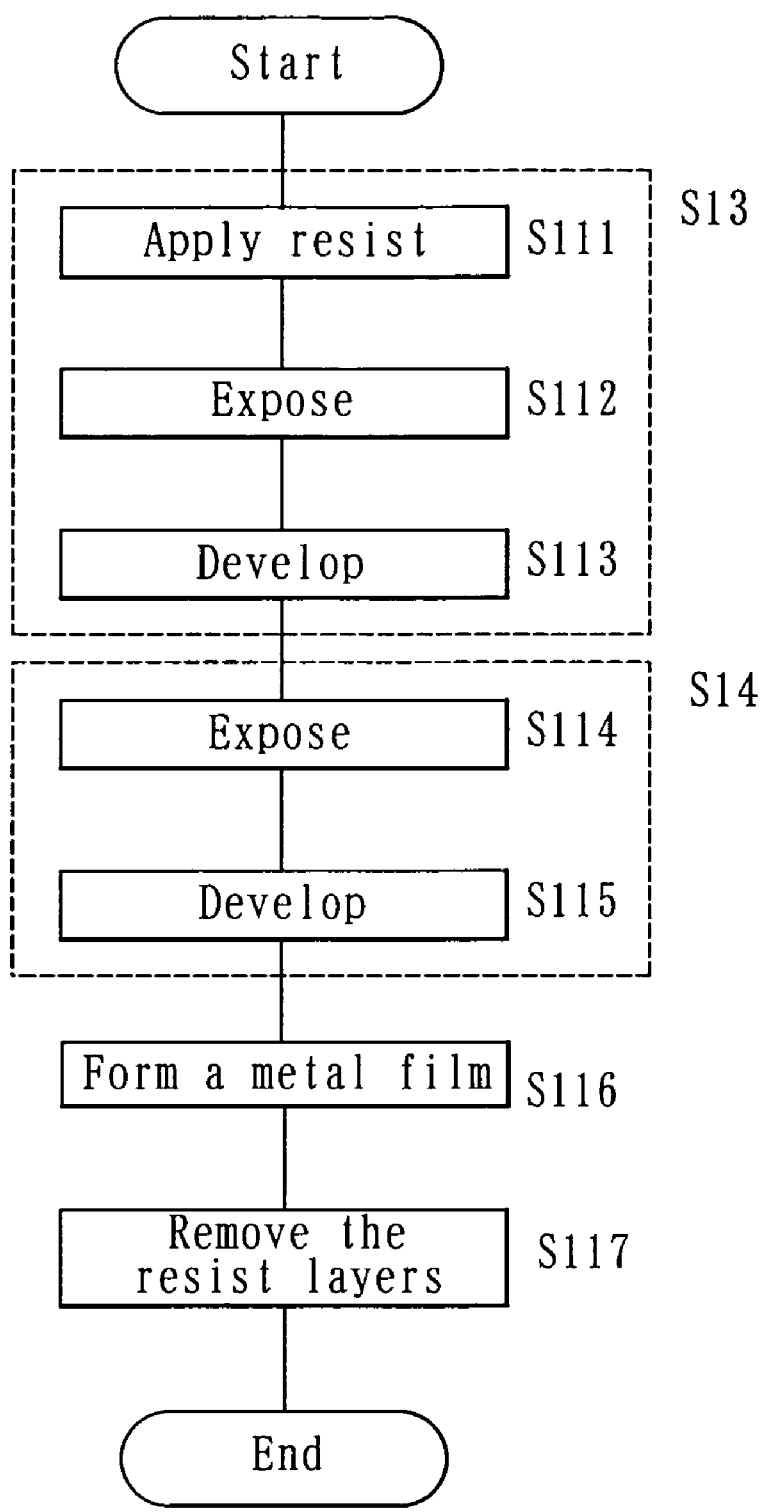
FIG. 17 is a flowchart showing a method of writing identifying information of a third embodiment of the invention.
Figure 19A:
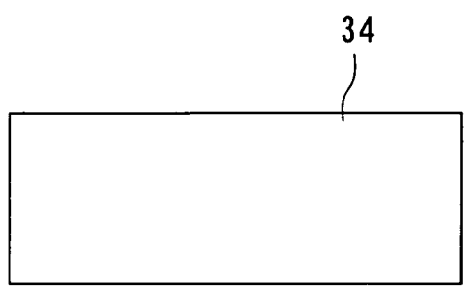
FIG. 19A to FIG. 19D are views for illustrating a step that follows the step shown in FIG. 18A to FIG. 18D.
Figure 19B:
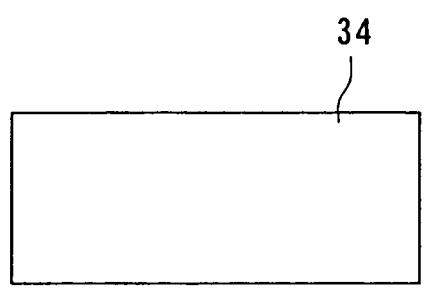
Figure 19C:
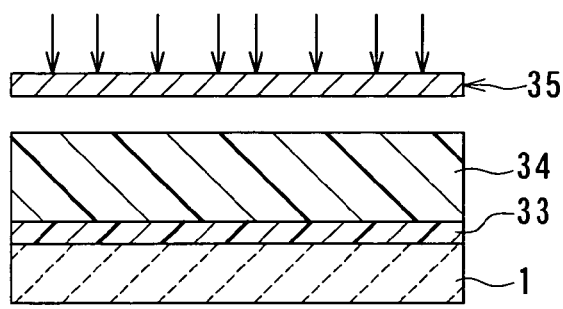
Figure 19D:
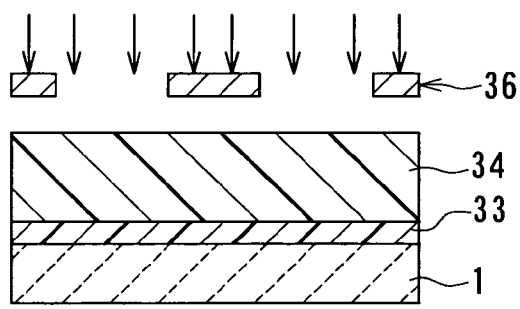
Figure 20A:
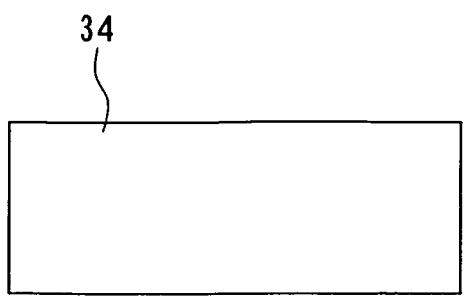
FIG. 20A to FIG. 20D are views for illustrating a step that follows the step shown in FIG. 19A to FIG. 19D.
Figure 20B:
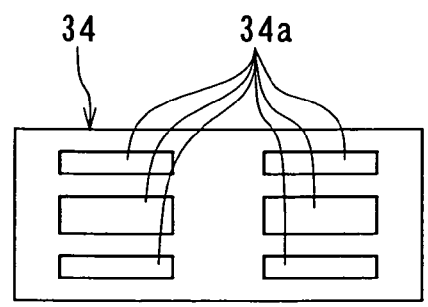
Figure 20C:
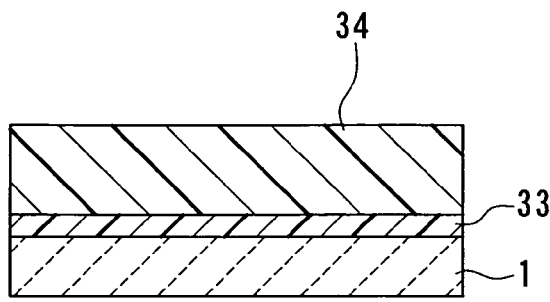
Figure 20D:
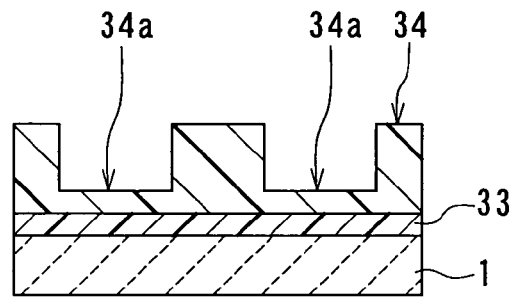
Figure 22A:
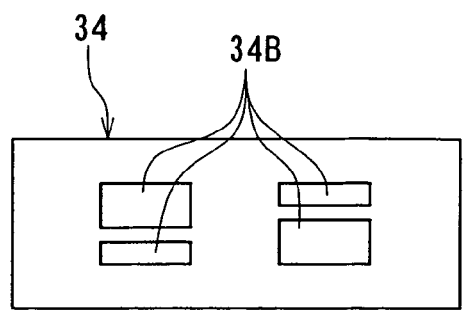
FIG. 22A to FIG. 22D are views for illustrating a step that follows the step shown in FIG. 21A to FIG. 21D.
Figure 22B:
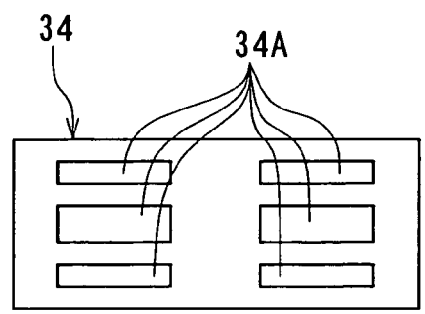
Figure 22C:
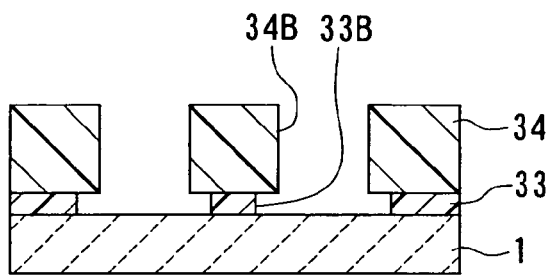
Figure 22D:
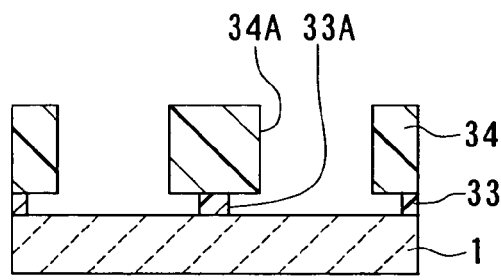
Figure 23A:
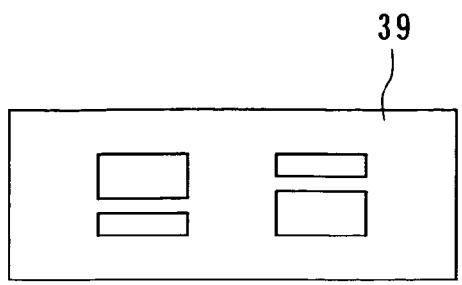
FIG. 23A to FIG. 23D are views for illustrating a step that follows the step shown in FIG. 22A to FIG. 22D.
Figure 23B:
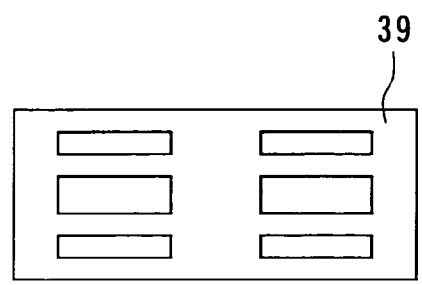
Figure 23C:
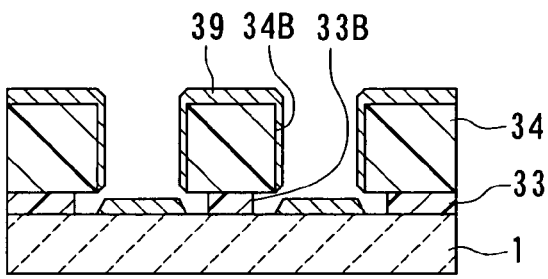
Figure 23D:
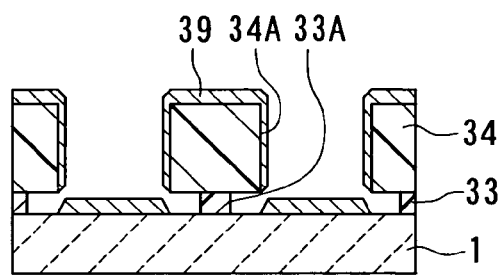
Figure 24A:
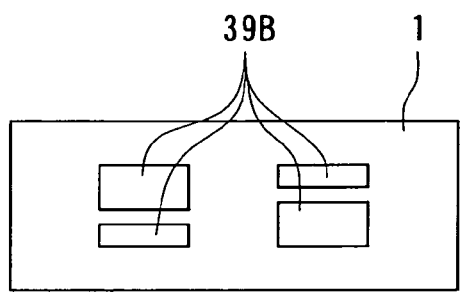
FIG. 24A to FIG. 24D are views for illustrating a step that follows the step shown in FIG. 23A to FIG. 23D.
Figure 24B:
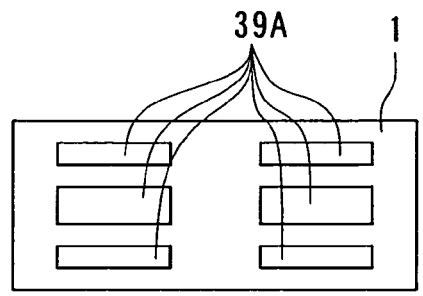
Figure 24C:
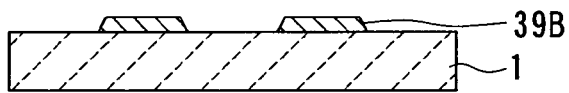
Figure 24D:
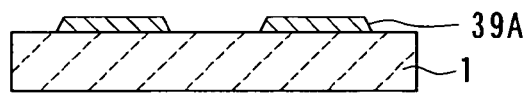

Reference is now made to FIG. 17, FIG. 18A to FIG. 24A, FIG. 18B to FIG. 24B, FIG. 18C to FIG. 24C, and FIG. 18D to FIG. 24D to describe a method of writing identifying information on a wafer of a third embodiment of the invention. FIG. 17 is a flowchart showing the method of writing identifying information of the third embodiment. FIG. 18A to FIG. 24A, FIG. 18B to FIG. 24B, FIG. 18C to FIG. 24C, and FIG. 18D to FIG. 24D are views for illustrating the steps of the method. FIG. 18A to FIG. 24A, FIG. 18B to FIG. 24B, FIG. 18C to FIG. 24C, and FIG. 18D to FIG. 24D each illustrate a state of a layered structure made up of the wafer 1 and layers formed thereon. FIG. 18A to FIG. 24A each illustrate a top surface of a region in which the identifying information 5 is to be located. FIG. 18B to FIG. 24B each illustrate a top surface of a region in which the alignment mark 3 is to be located. FIG. 18C to FIG. 24C each illustrate a cross section of the region in which the identifying information 5 is to be located. FIG. 18D to FIG. 24D each illustrate a cross section of the region in which the alignment mark 3 is to be located.

In the method of writing the identifying information of the third embodiment, first, as shown in FIG. 18A to FIG. 18D, two resist layers 33 and 34 are formed by applying two kinds of resists to the wafer 1 one by one (step S111). The resist layer 33 is the lower one and the resist layer 34 is the upper one. Although an example is given here in which the resists forming the resist layers 33 and 34 are positive ones, the resists may be negative ones. The lower resist layer 33 may be one that is not photosensitive as long as it is soluble in a developer. Although FIG. 18A to FIG. 18D show the example in which the two resist layers 33 and 34 are formed, a single resist layer may be formed by applying one kind of resist to the wafer 1.

Next, as shown in FIG. 19A to FIG. 19D, the resist layers 33 and 34 are exposed through masks 35 and 36 (step S112). The mask 35 is formed to intercept light in an entire region where the identifying information 5 is to be located. The mask 36 has a first pattern for the alignment mark 3. That is, the mask 36 is designed so that, in the region where the alignment mark 3 is to be located, light is allowed to pass through in portions corresponding to the pattern of the alignment mark 3, and light is intercepted in the other portions. In this step, the first pattern for the alignment mark 3 is projected onto the resist layers 33 and 34, and the resist layers 33 and 34 are thereby exposed based on the first pattern. This step is performed for each of the exposure regions 2 and repeated until exposure of all the exposure regions 2 is completed. This step corresponds to the first exposure step of the invention.

Next, as shown in FIG. 20A to FIG. 20D, the resist layers 33 and 34 are developed to form patterns to be references of locations in the resist layers 33 and 34 (step S113). This step corresponds to the first development step of the invention. In the embodiment, development is performed such that parts of portions of the resist layers 33 and 34 soluble in the developer remain, the parts being close to the wafer 1. If the resists forming the resist layers 33 and 34 are positive, the portions to which light for exposure is applied become soluble in the developer. If the resists forming the resist layers 33 and 34 are negative, the portions to which light for exposure is not applied become soluble in the developer.

It is possible to perform development such that the parts close to the wafer 1 of the portions of the resist layers 33 and 34 soluble in the developer remain, by adjusting the development time, adjusting the magnitude of exposure in the step S112, and adjusting the temperature at which prebake or bake before development of the resist layers 33 and 34 is performed, for example.

FIG. 20A to FIG. 20D show an example in which development is performed such that the entire resist layer 33 touching the wafer 1 and a part of the resist layer 34 close to the wafer 1 remain. In this example, the resist layer 34 developed has a concave portion 34a located in the region where the alignment mark 3 is to be located. The concave portion 34a has a shape corresponding to the pattern of the alignment mark 3. In the embodiment it is possible to recognize the location and shape of the concave portion 34a by observing the concave portion 34a with a microscope, for example. In the embodiment the pattern of the concave portion 34a is the one that serves as the reference of the location. In FIG. 17 the steps surrounded by the broken line indicated with S13, that is, the steps from S111 to S113, are the photolithography steps for forming the alignment mark 3.

Next, as shown in FIG. 21A to FIG. 21D, the resist layers 33 and 34 are exposed through masks 37 and 38 (step S114). The mask 37 has a second pattern for the identifying information 5. That is, the mask 37 is designed such that, in the region where the identifying information 5 is to be located, light is allowed to pass through in portions corresponding to the pattern of the identifying information 5, and light is intercepted in the other portions. The mask 38 is formed to intercept light in the entire region where the alignment mark 3 is to be located. In this step, the second pattern for the identifying information 5 is projected onto the resist layer 34, and the resist layers 33 and 34 are thereby exposed based on the second pattern. Since the identifying information 5 includes the wafer identifying information 5A and the element location identifying information 5B, the resist layers 33 and 34 are actually multi-exposed based on the pattern for the wafer identifying information 5A and the pattern for the element location identifying information 5B. This step is performed for each of the exposure regions 2 and repeated until exposure of all the exposure regions 2 is completed. In this step, exposure is performed such that the second pattern for the identifying information 5 is projected for each of the element regions 4. This step corresponds to the second exposure step of the invention.

Projection of the second pattern onto the resist layers 33 and 34 is performed using the pattern formed in the resist layer 34 in the development step of the step S113, that is, the pattern of the concave portion 34a, as the reference of the location. That is, the masks 37 and 38 are aligned using the pattern formed in the resist layer 34 in the development step of the step S113, that is, the pattern of the concave portion 34a, as the reference of the location. The concave portion 34a has a shape corresponding to the pattern of the alignment mark 3. Therefore, although the alignment mark 3 is not formed yet at this point, it is possible to align the masks 37 and 38 in a manner similar to the case in which alignment is performed using the alignment mark 3 as the reference of the location after the alignment mark 3 is formed.

Next, as shown in FIG. 22A to FIG. 22D, the resist layers 33 and 34 are developed to form the patterned resist layers 33 and 34 (step S115). The resist layers 33 and 34 developed respectively have grooves 33A and 34A formed in the region where the alignment mark 3 is to be located, and grooves 33B and 34B formed in the region where the identifying information 5 is to be located. Each of the grooves 33A and 34A has a shape corresponding to the pattern of the alignment mark 3. Each of the grooves 33B and 34B has a shape corresponding to the pattern of the identifying information 5. FIG. 22A to FIG. 22D show an example in which the width of the resist layer 33 is smaller than that of the resist layer 34, so that the layered structure made up of the resist layers 33 and 34 has a shape with undercuts. This step corresponds to the second development step of the invention. In FIG. 17 the steps surrounded by the broken line indicated with S14, that is, the steps S114 and S115, are the photolithography steps for writing the identifying information 5.

Next, as shown in FIG. 23A to FIG. 23D, a metal film 39 is formed by sputtering, for example, on the entire top surface of the layered structure (step S116).

Next, as shown in FIG. 24A to FIG. 24D, the resist layers 33 and 34 are removed (lifted off) (step S117), and the steps for writing the identifying information 5 are thereby completed. As a result, in the region in which the alignment mark 3 is to be located, portions of the metal film 39 that correspond to the pattern of the alignment mark 3 only remain on the wafer 1. These remaining portions of the metal film 39 become a patterned film 39A indicating the alignment mark 3. In the region where the identifying information 5 is to be located, portions of the metal film 39 that correspond to the pattern of the identifying information 5 only remain on the wafer 1. These remaining portions of the metal film 39 become a patterned film 39B indicating the identifying information 5. In this step, in the manner thus described, the patterned film 39A for the alignment mark 3 and the patterned film 39B for the identifying information 5 are formed through the use of the patterned resist layers 33 and 34, wherein the patterned film 39A is patterned based on the first pattern while the patterned film 39B is patterned based on the second pattern. This step corresponds to the patterned film forming step of the invention. In the embodiment the patterned films 39A and 39B are formed at the same height, using the same material.

The remainder of configuration, function and effect of the third embodiment are similar to those of the first embodiment.

Fourth Embodiment

Figure 25:
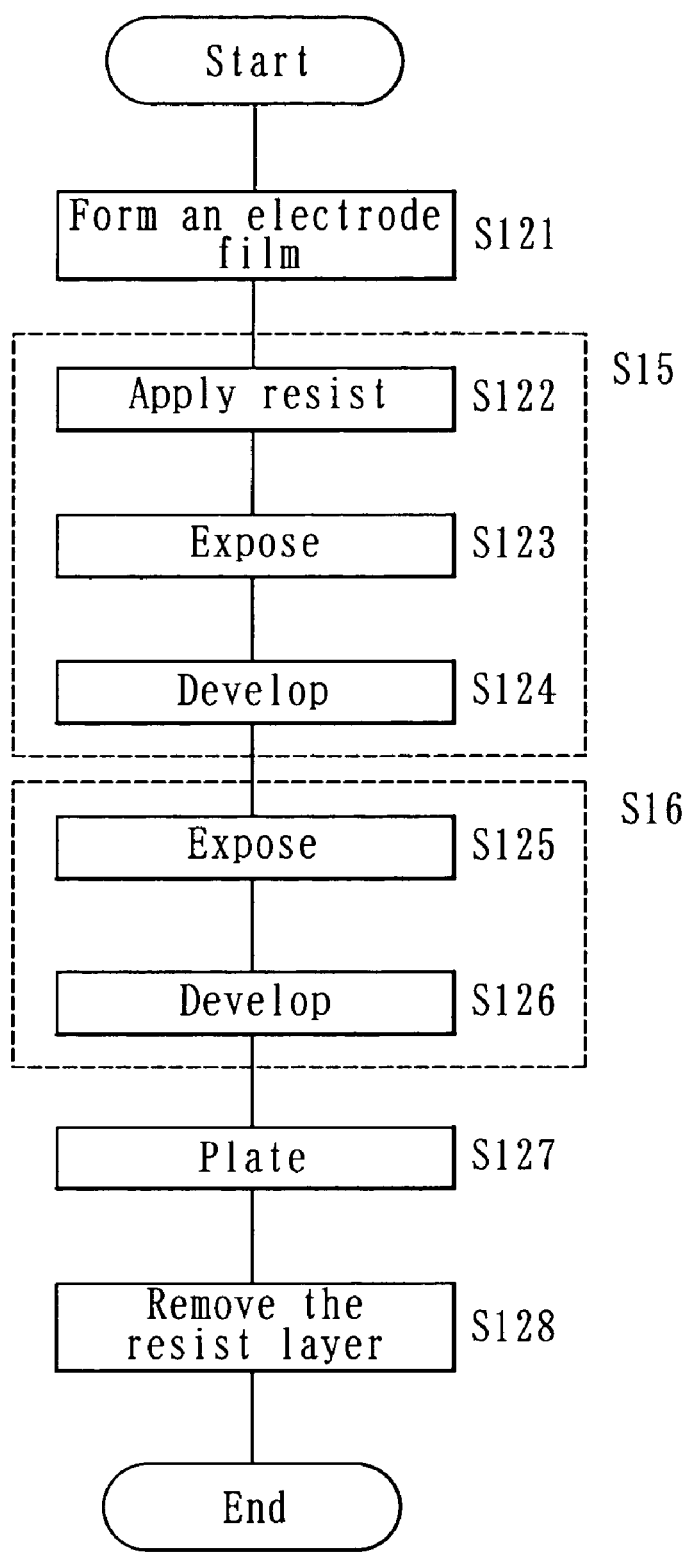
FIG. 25 is a flowchart showing a method of writing identifying information of a fourth embodiment of the invention.
Figure 26A:
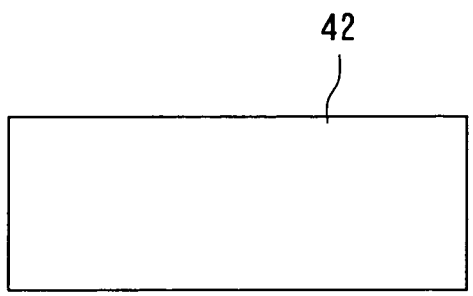
FIG. 26A to FIG. 26D are views for illustrating a step of the method of writing identifying information of the fourth embodiment of the invention.
Figure 26B:
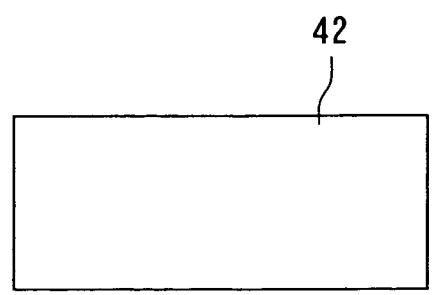
Figure 26C:
Figure 26D:
Figure 27A:
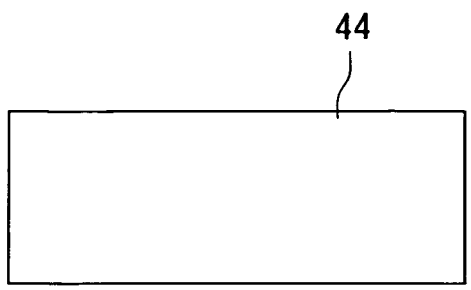
FIG. 27A to FIG. 27D are views for illustrating a step that follows the step shown in FIG. 26A to FIG. 26D.
Figure 27B:
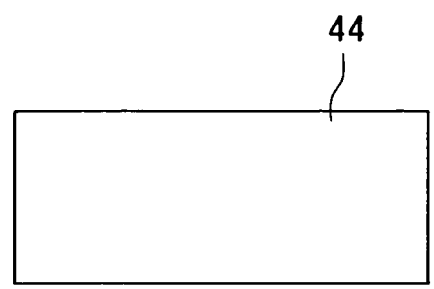
Figure 27C:
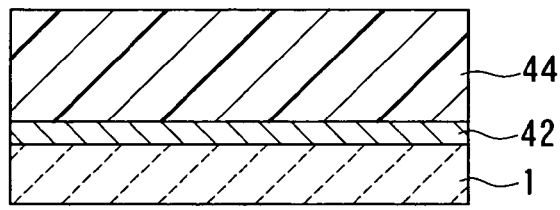
Figure 27D:
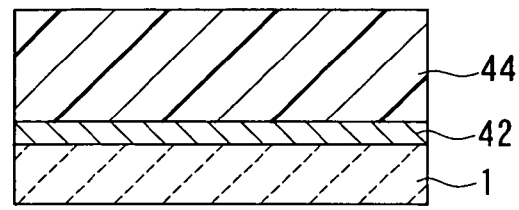
Figure 29A:
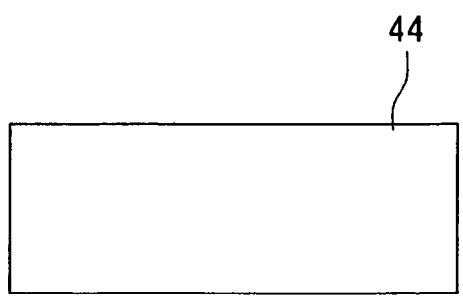
FIG. 29A to FIG. 29D are views for illustrating a step that follows the step shown in FIG. 28A to FIG. 28D.
Figure 29B:
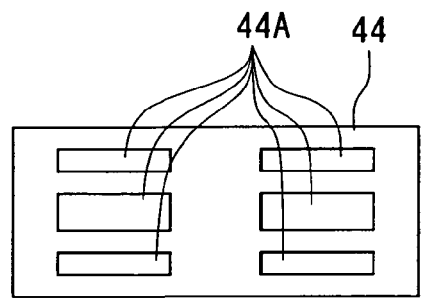
Figure 29C:
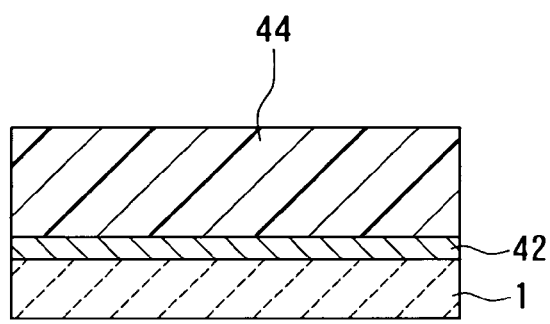
Figure 29D:
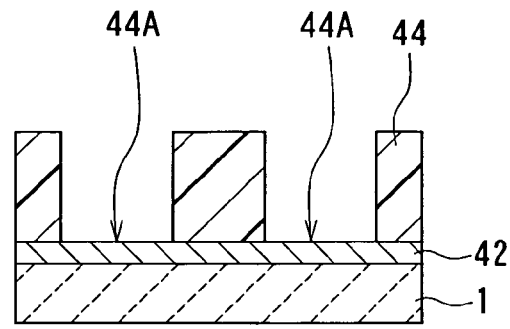
Figure 31A:
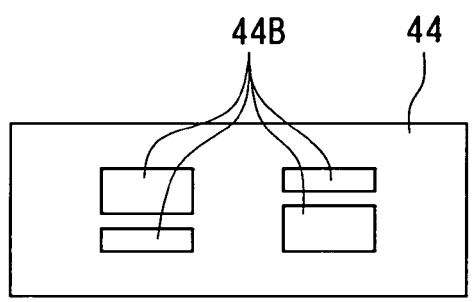
FIG. 31A to FIG. 31D are views for illustrating a step that follows the step shown in FIG. 30A to FIG. 30D.
Figure 31B:
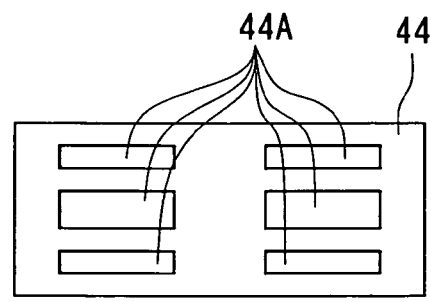
Figure 31C:
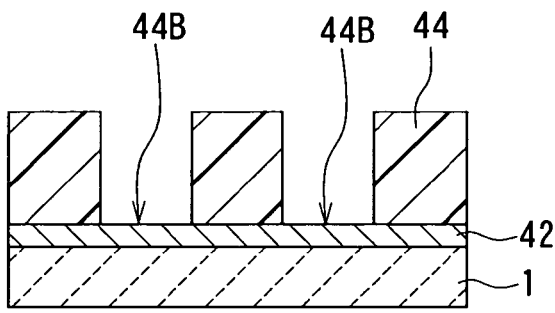
Figure 31D:
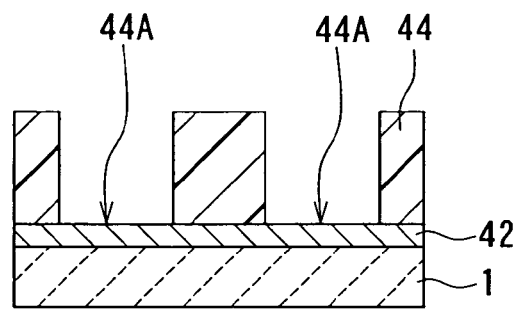
Figure 32A:
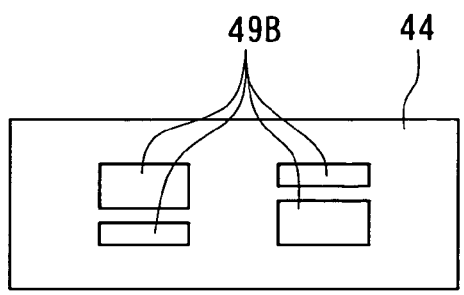
FIG. 32A to FIG. 32D are views for illustrating a step that follows the step shown in FIG. 31A to FIG. 31D.
Figure 32B:
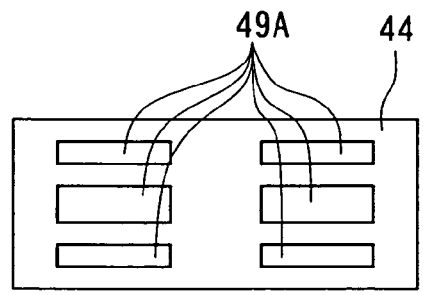
Figure 32C:
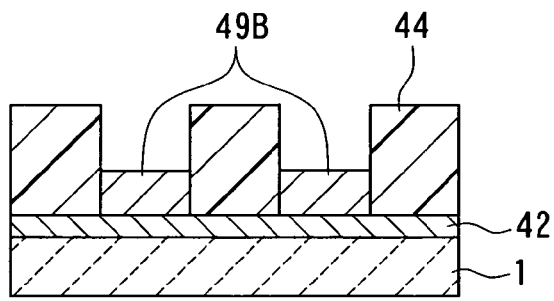
Figure 32D:
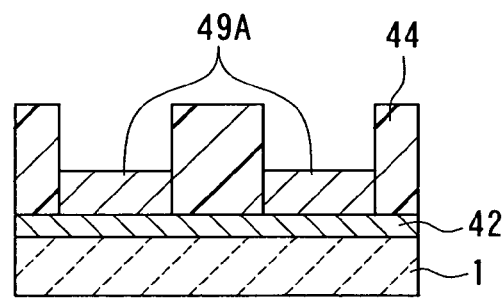
Figure 33A:
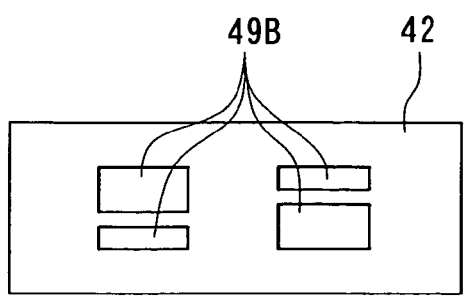
FIG. 33A to FIG. 33D are views for illustrating a step that follows the step shown in FIG. 32A to FIG. 32D.
Figure 33B:
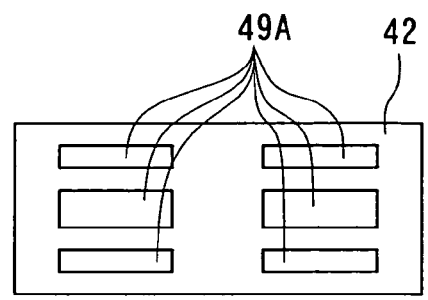
Figure 33C:
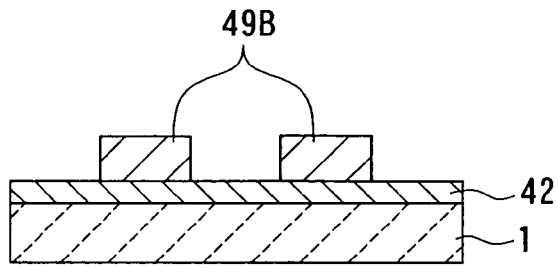
Figure 33D:
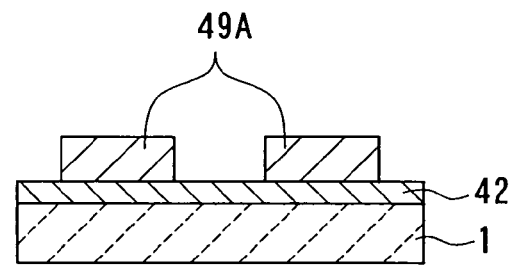

Reference is now made to FIG. 25, FIG. 26A to FIG. 33A, FIG. 26B to FIG. 33B, FIG. 26C to FIG. 33C, and FIG. 26D to FIG. 33D to describe a method of writing identifying information on a wafer of a fourth embodiment of the invention. FIG. 25 is a flowchart showing the method of writing identifying information of the fourth embodiment. FIG. 26A to FIG. 33A, FIG. 26B to FIG. 33B, FIG. 26C to FIG. 33C, and FIG. 26D to FIG. 33D are views for illustrating the steps of the method. FIG. 26A to FIG. 33A, FIG. 26B to FIG. 33B, FIG. 26C to FIG. 33C, and FIG. 26D to FIG. 33D each illustrate a state of a layered structure made up of the wafer 1 and layers formed thereon. FIG. 26A to FIG. 33A each illustrate a top surface of a region in which the identifying information 5 is to be located. FIG. 26B to FIG. 33B each illustrate a top surface of a region in which the alignment mark 3 is to be located. FIG. 26C to FIG. 33C each illustrate a cross section of the region in which the identifying information 5 is to be located. FIG. 26D to FIG. 33D each illustrate a cross section of the region in which the alignment mark 3 is to be located.

In the method of writing the identifying information of the fourth embodiment, first, as shown in FIG. 26A to FIG. 26D, an electrode film 42 for plating is formed by sputtering, for example, on the wafer 1 (step S121).

Next, as shown in FIG. 27A to FIG. 27D, a resist layer 44 is formed by applying a resist to the top of the electrode film 42 (step S122). Although an example is given here in which the resist forming the resist layer 44 is positive one, the resist may be negative one.

Next, as shown in FIG. 28A to FIG. 28D, the resist layer 44 is exposed through the masks 35 and 36 (step S123). The masks 35 and 36 are the same as those of the third embodiment. In this step, the first pattern for the alignment mark 3 that the mask 36 has is projected onto the resist layer 44, and the resist layer 44 is thereby exposed based on the first pattern. This step is performed for each of the exposure regions 2 and repeated until exposure of all the exposure regions 2 is completed. This step corresponds to the first exposure step of the invention.

Next, as shown in FIG. 29A to FIG. 29D, the resist layer 44 is developed (step S124). This step corresponds to the first development step of the invention. In the embodiment, development is performed such that portions of the resist layer 44 soluble in the developer are all removed. If the resist forming the resist layer 44 is positive, the portions to which light for exposure is applied become soluble in the developer. If the resist forming the resist layer 44 is negative, the portions to which light for exposure is not applied become soluble in the developer.

The resist layer 44 developed has a groove 44A located in the region where the alignment mark 3 is to be located. The groove 44A has a shape corresponding to the pattern of the alignment mark 3. In the embodiment it is possible to recognize the location and shape of the groove 44A by observing the groove 44A with a microscope, for example. In the embodiment the pattern of the groove 44A is the one that serves as the reference of the location. In FIG. 25 the steps surrounded by the broken line indicated with S15, that is, the steps from S122 to S124 are the photolithography steps for forming the alignment mark 3.

Next, as shown in FIG. 30A to FIG. 30D, the resist layer 44 is exposed through the masks 37 and 38 (step S125). The masks 37 and 38 are the same as those of the third embodiment. In this step, the second pattern for the identifying information 5 that the mask 37 has is projected onto the resist layer 44, and the resist layer 44 is thereby exposed based on the second pattern. Since the identifying information 5 includes the wafer identifying information 5A and the element location identifying information 5B, the resist layer 44 is actually multi-exposed based on the pattern for the wafer identifying information 5A and the pattern for the element location identifying information 5B. This step is performed for each of the exposure regions 2 and repeated until exposure of all the exposure regions 2 is completed. This step corresponds to the second exposure step of the invention.

Projection of the second pattern onto the resist layer 44 is performed using the pattern formed in the resist layer 44 in the development step of the step S124, that is, the pattern of the groove 44A, as the reference of the location. That is, the masks 37 and 38 are aligned using the pattern formed in the resist layer 44 in the development step of the step S124, that is, the pattern of the groove 44A, as the reference of the location. The groove 44A has a shape corresponding to the pattern of the alignment mark 3. Therefore, although the alignment mark 3 is not formed yet at this point, it is possible to align the masks 37 and 38 in a manner similar to the case in which alignment is performed using the alignment mark 3 as the reference of location after the alignment mark 3 is formed.

Next, as shown in FIG. 31A to FIG. 31D, the resist layer 44 is developed to form the patterned resist layer 44 (step S126). The resist layer 44 developed has the groove 44A formed in the region where the alignment mark 3 is to be located, and a groove 44B formed in the region where the identifying information 5 is to be located. The groove 44A has a shape corresponding to the pattern of the alignment mark 3. The groove 44B has a shape corresponding to the pattern of the identifying information 5. This step corresponds to the second development step of the invention.

Next, as shown in FIG. 32A to FIG. 32D, a metal film is formed by plating in the grooves 44A and 44B of the resist layer 44 (step S127). The metal film formed in the groove 44A becomes a patterned film 49A indicating the alignment mark 3. The metal film formed in the groove 44B becomes a patterned film 49B indicating the identifying information 5. In this step, in the manner thus described, the patterned film 49A for the alignment mark 3 and the patterned film 49B for the identifying information 5 are formed through the use of the patterned resist layer 44, wherein the patterned film 49A is patterned based on the first pattern while the patterned film 49B is patterned based on the second pattern. This step corresponds to the patterned film forming step of the invention. In the embodiment the patterned films 49A and 49B are formed at the same height, using the same material. Next, as shown in FIG. 33A to FIG. 33D, the resist layer 44 is removed (step S128), and the steps for writing the identifying information 5 are thereby completed.

The remainder of configuration, function and effect of the fourth embodiment are similar to those of the third embodiment.

The present invention is not limited to the foregoing embodiments but may be practiced in still other ways. For example, although both the wafer identifying information 5A and the element location identifying information 5B are written as the identifying information 5 on the wafer 1 in the foregoing embodiments, the invention is applicable to cases in which only one of the wafer identifying information 5A and the element location identifying information 5B is written on the wafer 1.

In the first and second embodiments, the patterned film 12A for the alignment mark 3 and the patterned film 12B for the identifying information 5 are formed at the same height, using the same metal film 12. However, the patterned films 12A and 12B may be formed by etching films made of different materials. In addition, it is not absolutely necessary that the patterned films 12A and 12B be formed at the same height. In the third embodiment, it is not absolutely necessary that the patterned films 39A and 39B be formed at the same height using the same material, either. In the fourth embodiment, it is not absolutely necessary that the patterned films 49A and 49B be formed at the same height using the same material, either.

Obviously many modifications and variations of the present invention are possible in the light of the above teachings. It is therefore to be understood that within the scope of the appended claims the invention may be practiced otherwise than as specifically described.

What is claimed is:

1. A method of writing identifying information on a wafer, wherein the identifying information is written through the use of at least one patterned resist layer on the wafer used for forming thin-film elements, the method comprising:
  a step of forming two resist layers on the wafer, the two resist layers consisting of a lower resist layer and an upper resist layer, the lower resist layer being soluble in a developer, the upper resist layer being formed of a positive resist and being photosensitive;
  a first exposure step of exposing the two resist layers based on a first pattern for an alignment mark by projecting the first pattern onto the two resist layers;
  a first development step of partially developing the upper resist layer to form a pattern to be a reference of a location in the upper resist layer, the first development step being performed after the first exposure step and performed such that a portion of the exposed upper resist layer exposed in the first exposure step is partially removed, but the portion is not completely removed down to the lower resist layer,
  a second exposure step of exposing the two resist layers based on a second pattern for the identifying information by projecting the second pattern onto the two resist layers, using the pattern formed in the upper resist layer in the first development step as the reference of the location;
  a second development step of developing the two resist layers to form two patterned resist layers after the second exposure step, the two patterned resist layers in combination having a shape with undercuts;
  a patterned film forming step of forming a patterned film for the alignment mark that is patterned based on the first pattern and a patterned film for the identifying information that is patterned based on the second pattern, using the two patterned resist layers; and
  removing the two patterned resist layers.

2. The method according to claim 1, further comprising a step of forming a film to be etched that is located below the two resist layers, the step being performed before the step of forming the two resist layers, wherein, in the patterned film forming step, the film to be etched is selectively etched using the two patterned resist layers as etching masks, and the patterned film for the alignment mark and the patterned film for the identifying information are thereby formed of remaining portions of the film etched.

3. The method according to claim 1, wherein:

the two patterned resist layers respectively have penetrating spaces; and in the patterned film forming step, the patterned film for the alignment mark and the patterned film for the identifying information are formed by forming a film in each of the penetrating spaces of the two patterned resist layers.

4. The method according to claim 1, wherein:

in the first exposure step, a plurality of exposure regions are predetermined on the wafer, and processing of projecting the first pattern onto the two resist layers is repeated for the respective exposure regions; and in the second exposure step, processing of projecting the second pattern onto the two resist layers is repeated for the respective exposure regions.

5. The method according to claim 4, wherein:

a plurality of element regions in each of which a thin-film element is to be formed are predetermined in the exposure regions; and, in the second exposure step, exposure is performed such that the second pattern is projected for each of the element regions.

6. The method according to claim 1, wherein the identifying information includes wafer identifying information for identifying the wafer.

7. The method according to claim 1, wherein the identifying information includes element location identifying information for identifying a location of each of the thin-film elements in the wafer.

8. A method of writing identifying information on a wafer, wherein the identifying information is written through the use of at least one patterned resist layer on the wafer used for forming thin-film elements, the method comprising:

a step of forming two resist layers on the wafer, the two resist layers consisting of a lower resist layer and an upper resist layer, the lower resist layer being soluble in a developer, the upper resist layer being formed of a negative resist and being photosensitive;

a first exposure step of exposing the two resist layers based on a first pattern for an alignment mark by projecting the first pattern onto the two resist layers;

a first development step of partially developing the upper resist layer to form a pattern to be a reference of a location in the upper resist layer, the first development step being performed after the first exposure step and performed such that a portion of a non-exposed region of the upper resist layer non-exposed in the first exposure step is partially removed, but is not completely removed down to the lower resist layer;

a second exposure step of exposing the two resist layers based on a second pattern for the identifying information by projecting the second pattern onto the two resist layers, using the pattern formed in the upper resist layer in the first development step as the reference of the location;

a second development step of developing the two resist layers to form two patterned resist layers after the second exposure step, the two patterned resist layers in combination having a shape with undercuts;

a patterned film forming step of forming a patterned film for the alignment mark that is patterned based on the first pattern and a patterned film for the identifying information that is patterned based on the second pattern, using the two patterned resist layers; and removing the two patterned resist layers.

9. The method according to claim 8, further comprising a step of forming a film to be etched that is located below the two resist layers, the step being performed before the step of forming the two resist layers, wherein, in the patterned film forming step, the film to be etched is selectively etched using the two patterned resist layers as etching masks, and the patterned film for the alignment mark and the patterned film for the identifying information are thereby formed of remaining portions of the film to be etched.

10. The method according to claim 8, wherein:

the two patterned resist layers respectively have penetrating spaces; and in the patterned film forming step, the patterned film for the alignment mark and the patterned film for the identifying information are formed by forming a film in each of the penetrating spaces of the two patterned resist layers.

11. The method according to claim 8, wherein:

in the first exposure step, a plurality of exposure regions are predetermined on the wafer, and processing of projecting the first pattern onto the two resist layers is repeated for the respective exposure regions; and in the second exposure step, processing of projecting the second pattern onto the two resist layers is repeated for the respective exposure regions.

12. The method according to claim 11, wherein:

a plurality of element regions in each of which a thin-film element is to be formed are predetermined in the exposure regions; and in the second exposure step, exposure is performed such that the second pattern is projected for each of the element regions.

13. The method according to claim 8, wherein the identifying information includes wafer identifying information for identifying the wafer.

14. The method according to claim 8, wherein the identifying information includes element location identifying information for identifying a location of each of the thin-film elements in the wafer.

* * * * *